United States Patent
Henderson et al.

(10) Patent No.: US 6,362,993 B1
(45) Date of Patent: Mar. 26, 2002

(54) CONTENT ADDRESSABLE MEMORY DEVICE

(75) Inventors: Alex E. Henderson, Hillsborough; Walter E. Croft, San Mateo, both of CA (US)

(73) Assignee: Fast-Chip Incorporated, Sunnyvale, CA (US)

(*) Notice: Subject to any disclaimer, the term of this patent is extended or adjusted under 35 U.S.C. 154(b) by 0 days.

(21) Appl. No.: 09/711,989

(22) Filed: Nov. 13, 2000

Related U.S. Application Data

(63) Continuation of application No. 09/384,810, filed on Aug. 27, 1999, now Pat. No. 6,175,514, which is a continuation of application No. 09/231,284, filed on Jan. 15, 1999, now Pat. No. 5,999,435.

(51) Int. Cl.[7] .............................................. G11C 15/00
(52) U.S. Cl. ...................................... 365/49; 365/189.07
(58) Field of Search .............................. 365/49, 189.07, 365/156

(56) References Cited

U.S. PATENT DOCUMENTS

| | | | |
|---|---|---|---|
| 5,469,378 A | 11/1995 | Albon et al. | 365/49 |
| 5,471,189 A | 11/1995 | Dietz et al. | 240/146.2 |
| 5,706,224 A | 1/1998 | Srinivasan | 365/49 |
| 5,828,593 A | 10/1998 | Schultz et al. | 365/49 |

*Primary Examiner*—Vu A. Le
(74) *Attorney, Agent, or Firm*—Fenwick & West LLP

(57) ABSTRACT

A content addressable memory device is provided which may include a novel CAM cell structure which reduces the total power dissipated by the CAM and improves the match time for the CAM. The novel CAM cell structure may include a CMOS implemented compare cell and a wide AND gate which combines the match decisions for each CAM cell into a match decision. The CAM cell structure may be implemented in a variety of different CAM devices, including dual port CAM devices, CAM devices with individual bit masking, event co-processors and database co-processors.

16 Claims, 21 Drawing Sheets

CONTENT ADDRESSABLE MEMORY DEVICE

RELATED APPLICATIONS

This is a continuation of application Ser. No. 09/384,810 filed on Aug. 27, 1999, now U.S. Pat. No. 6,175,514 which is incorporated by reference herein in its entirety, which is a continuation of Ser. No. 09/231,284 filed Jan. 15, 1999, U.S. Pat. No. 5,999,435.

BACKGROUND OF THE INVENTION

This invention relates generally to semiconductor memories and in particular to a memory, known as a content addressable memory, in which the data is accessed and modified based upon the content of the stored data.

A content addressable memory (CAM) semiconductor device is a well known device which permits the contents of the memory to be searched and matched instead of having to specify one or more particular memory location(s) in order to retrieve data from the memory. A CAM may be used to accelerate any application requiring fast searches of a database, list, or pattern, such as in database machines, image or voice recognition, or computer and communication networks. A CAM provides a performance advantage over conventional memory devices with conventional memory search algorithms, such as binary or tree-based searches, by comparing the desired information against the entire list of entries simultaneously, giving an order-of-magnitude reduction in the search time. For example, a binary search through a database of 1000 entries may take ten separate search steps whereas a CAM device with 1000 entries may be search in a single operation resulting in a search which takes ten times less time. One example of an application in which CAM devices are often used is to store a routing table for high speed switching systems which need to rapidly search the routing table to look for a matching destination address so that a data packet may be routed to the appropriate destination address.

To better understand a CAM and its operation, the CAM structure and operation may be compared to conventional well-known random access memory (RAM) devices. A RAM device is an integrated circuit that temporarily stores data in an array of memory cells. In the RAM device, each stored piece of data may be accessed independently of any other piece of data. The data in a RAM is stored at a particular location called an address so that any piece of data in the RAM may be accessed by indicating the address at which the data is located. The RAM devices are often used for memory of a computer. Typical RAM devices may be organized as 262,144 memory locations (commonly called 256K) by four bits wide, or 1,048,576 memory locations (commonly called 1 Megabyte) by eight bits wide, but other different organizations also exist.

Typical RAM devices are composed of an array of memory cells wherein each memory cell may store a bit of information. Each memory cell may have one or more transistors depending on the type of RAM which may include a static RAM (SRAM) or a dynamic RAM (DRAM). A typical complementary metal on silicon (CMOS) implemented SRAM may have six transistors per memory cell in which four of the transistors are cross-coupled to store the state of the bit, and two transistors are used to alter or read out the state of the bit. For a SRAM, the state of the bit remains at one level or the other until deliberately changed or power is removed. DRAMs, on the other hand, have a dynamic storage unit which typically may include a single transistor and a capacitor which stores the bit information. During a read, the charge on the capacitor is drained to the bit line, requiring a rewrite of the bit, called a restore operation. Additionally, because the DRAM capacitor is not perfect, it loses charge over time, and needs to have its charge refreshed at regular intervals. Thus, dynamic memories are accompanied by controller circuits to rewrite the bit and refresh the stored charge on a regular basis.

A content addressable memory (CAM) device is organized differently from typical SRAM or DRAM devices. In particular, data in a CAM is stored in memory locations in a somewhat random fashion. The memory locations may be selected by an address bus or the data can be written directly into the first empty memory location because every location has a pair of special status bits that keep track of whether the location has valid information in it or is empty and therefore available for overwriting. As opposed to RAM devices in which information is accessed by specifying a particular memory location, once information is stored in a memory location of the CAM, it may be located by comparing every bit in the memory with data placed in a special register known as a compare register. If there is a match of every bit in particular memory locations with every corresponding bit in the register, a Match Flag is asserted to let the user know that the data in the register was found in the CAM device. A priority encoder may sort out which matching memory location has the top priority if there is more than on matching entry, and makes the address of the matching memory location available to the user so that the user may access the matching data. Thus, with a CAM device, the user supplies a piece of data he wants to match to the CAM and get back the address of any matching pieces of data in the CAM.

Known CAM devices are based on typical SRAM or DRAM memory cells that have been modified by the addition of extra transistors that compare the state of the bit stored in each memory cell with the state of a bit of a register. Logically, CAM devices perform an exclusive-NOR function so that a match is only indicated if both the stored bit and the corresponding register bit have the same state (i.e., "1" or "0" ). Generally, CAM devices use a ten transistor memory cell including a six transistor SRAM memory cell and four pull-down NMOS transistors which accomplish the exclusive-NOR functionality and the match line driving. These CAM devices using the ten transistor memory cell may have approximately a 70 to 180 nonosecond (ns) match time and a power dissipation of approximately 0.6 to 1.9 watts. These CAM devices may have sizes which are 256k and smaller since larger sizes may cause power dissipation problems. These CAM devices as described above, however, have a number of problems, drawbacks and limitations.

One drawback is that known CAM devices have very small storage capacities as compared to other memory devices, such as DRAM devices and SRAM devices. These smaller storage capacities are due to the fact that the CAM storage size is principally limited by the large amount of power dissipated by each match line in the CAM. Each match line may have one or more NMOS pull-down transistor associated with it so that for a CAM having 4096 memory locations, a match request causes power dissipation from 4095 match lines transistors since all of the non-matching match lines output low signals. e.g., logic 0. Therefore the associated NMOS pull-down transistors will dissipate power. Another drawback is that attempts to increase the speed performance of conventional CAM devices causes other problems since the faster CAM device leads to increased power dissipation. The problem is that the power dissipation cannot be increased very much without exceeding maximum power dissipation levels. Thus, conventional CAM devices are limited in size and performance because of the power being dissipated by the transistors associated with the match lines.

Another drawback of conventional CAM devices is that the memory devices themselves do not have much built-in intelligence or management functions so that, for each new operation environment, a piece of software must be written which is then responsible for management of the functions of the CAM device. The CAM management functions may include disabling unused CAM memory cells, maintaining a list of available CAM memory cells and checking for and avoiding insertion of duplicate data in more than one CAM memory cell.

Thus, it is desirable to provide a content addressable memory which overcomes the above described drawbacks, problems and limitations of conventional CAM devices and it is to this end that the present invention is directed.

SUMMARY OF THE INVENTION

In accordance with the invention, a CAM cell architecture is provided which overcomes the above problems of conventional CAM devices. In particular, a new architecture for each CAM cell is provided which uses a new and different compare cell structure. The new structure may employ CMOS transistors and have a wide AND gate structure which provides significant advantages over and eliminates the power dissipation problems in conventional CAMs. In particular, the new architecture permits the size and speed of the CAM to be independent of the match line power dissipation, since it eliminates the match lines. In a CAM device of the invention, the match time is substantially improved. It is determined by the bit line drivers and the delay due to routing capacitance and gate delays, which results in match times comparable to current state of the art SRAM devices (approximately 7 ns) instead of the typical 50 ns match time for conventional CAM devices. In addition, since the new architecture reduces the power dissipation by the elimination of the match lines, the size of the CAM device of may increase significantly (e.g., by up to ten times the current size of conventional CAMs).

The CAM device of the invention also permits CAM cells to be stacked on top of each other in a novel layout. Multiple CAM cells may be easily stacked together to form CAM devices which are more dense than conventional CAM devices. In addition, the CAM may be dynamically reconfigurable to change the width and length of the CAM array and partition the memory between the CAM cells and the RAM cells. The CAM also has an improved management interface, an improved multiple match resolution circuitry, and a match queue for enhanced handling of multiple matches.

In accordance with the invention, a content addressable memory device is provided which has a content addressable memory element. The content addressable memory element comprises a memory cell that stores a bit and a compare cell that compares the bit in the memory cell to a compare bit and generates an output signal indicating whether the bit matches the compare bit. The device further comprises a logic gate that combines the outputs from the content addressable memory element with other content addressable memory elements to generate a signal indicating a matching entry in the content addressable memory device if the compare bits match the bits stored in the content addressable memory elements. The logic gate is geographically distributed throughout the content addressable memory device.

In accordance with another aspect of the invention, a content addressable memory device is provided. The device comprises a content addressable memory array comprising a plurality of content addressable memory elements. Each content addressable memory element comprises a memory cell that stores a bit and a compare cell that compares the bit in the memory cell to a compare bit and generates an output signal indicating whether the bit matches the compare bit. The device further comprises a logic gate that combines; the output of the compare cell from each content addressable memory element to generate a signal indicating a matching entry in the content addressable memory device if the compare bits match the bits stored in the content addressable memory elements.

DETAILED DESCRIPTION OF THE PREFERRED EMBODIMENTS

The invention is particularly applicable to a content addressable memory (CAM) device, such as that used as a single or dual port CAM memory, an event co-processor and a database co-processor, and it is in this context that the invention will be described. It will be appreciated, however, that the CAM device in accordance with the invention has greater utility, such as to other types of applications which require fast searching times. To better understand the invention, a conventional ten transistor CAM memory cell will be briefly described first to illustrate the differences between the conventional CAM memory cell and the CAM memory cell of the invention.

Figure 1:
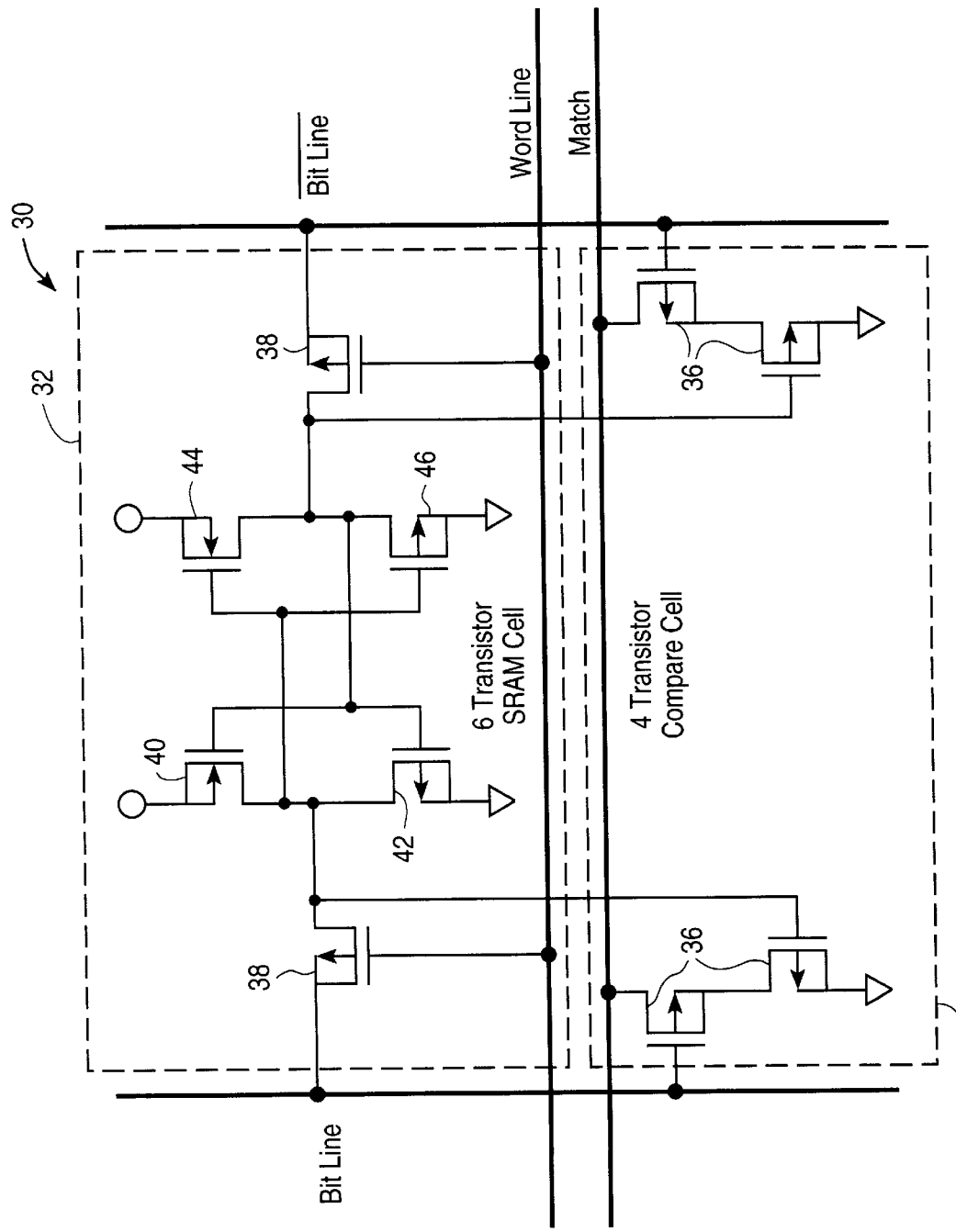
FIG. 1 is a block diagram illustrating a conventional ten transistor content addressable memory (CAM) cell.

FIG. 1 is a block diagram illustrating a conventional content addressable memory (CAM) 30. This conventional CAM has ten transistors which make up a memory cell 32 and a compare cell 34. In particular, the memory cell 32 is a conventional CMOS SRAM memory cell which uses six transistors. The compare cell 34 is a four transistor compare cell which uses NMOS pull-down type transistors 36. The memory cell 32 is a conventional SRAM memory cell and therefore will not be described here. The compare cell 34, during a match operation, compares the bit stored in the memory cell 32 to a corresponding bit of a compare register (not shown) associated with the CAM. Now, the operation of the conventional CAM memory cell will be briefly described to understand the power dissipation problem with the conventional CAM memory device.

When writing and reading data, the memory cell 32 acts like a typical SRAM cell with differential bit lines (Bit Line and $\overline{\text{BitLine}}$) to latch the value into the memory cell when writing and sense amps (not shown) that detect the stored value when reading. When writing data, the Word Line signal line is energized. This turns on a pair of pass transistors 38 which then forces a quartet of cross-coupled transistors 40, 42, 44, 46 to levels as determined by the levels on the differential bit lines. When the Word Line signal line is de-energized, the cross-coupled transistor 40–46 remain in the same states (e.g., "0" or "1") thus storing a bit in the memory cell. When reading, the differential bit lines (Bit Line and $\overline{\text{BitLine}}$) are precharged to the same intermediate voltage level, the Word Line signal line is energized, and then the bit lines are forced to the levels stored by the cross-coupled transistors 40–46. The sense amps respond to the differences in the bit lines and report the stored state to the outside world.

To compare the bit stored in the memory cell 32 to the corresponding bit in a compare register, a match line (Match) is precharged to a high level, the bit lines are driven by the levels of the bit stored in the compare register, but the word line is not energized so the states of the cross-coupled transistors 40–46 are not affected. The compare cell 34 (configured to operate as an exclusive-NOR logic gate) compares the internally stored states (e.g., "0" or "1") of the cross-coupled transistors with the state (e.g., "0" or "1") of the corresponding compare register bit on the bit line. If state of the register bit and the state of the bit stored in the memory cell 32 do not agree, the match line is pulled down by the transistors 36 in the compare cell which indicates a non-matching bit. All of the compare cells for all of the bits in a stored CAM entry are connected to the same match line, so that, if any bit in a memory cell does not match with its corresponding register bit, that Match line is pulled down so that the compare cell transistors 36 for that memory cell dissipate power. Thus, for this typical CAM memory cell, there may be a large number compare cell transistors which are dissipating power since few entries in the CAM typically are matched. In this conventional CAM memory device, all of the compare cells 34 are wire ANDed to the match line. Thus, the entries in the CAM in which the match line stays at a high level are the only matches. All the match lines may then be fed into a priority encoder (not shown) that determines whether any match exist, whether more than one match exists, and which matching location, it there is more than one, is considered the highest priority.

Figure 3:
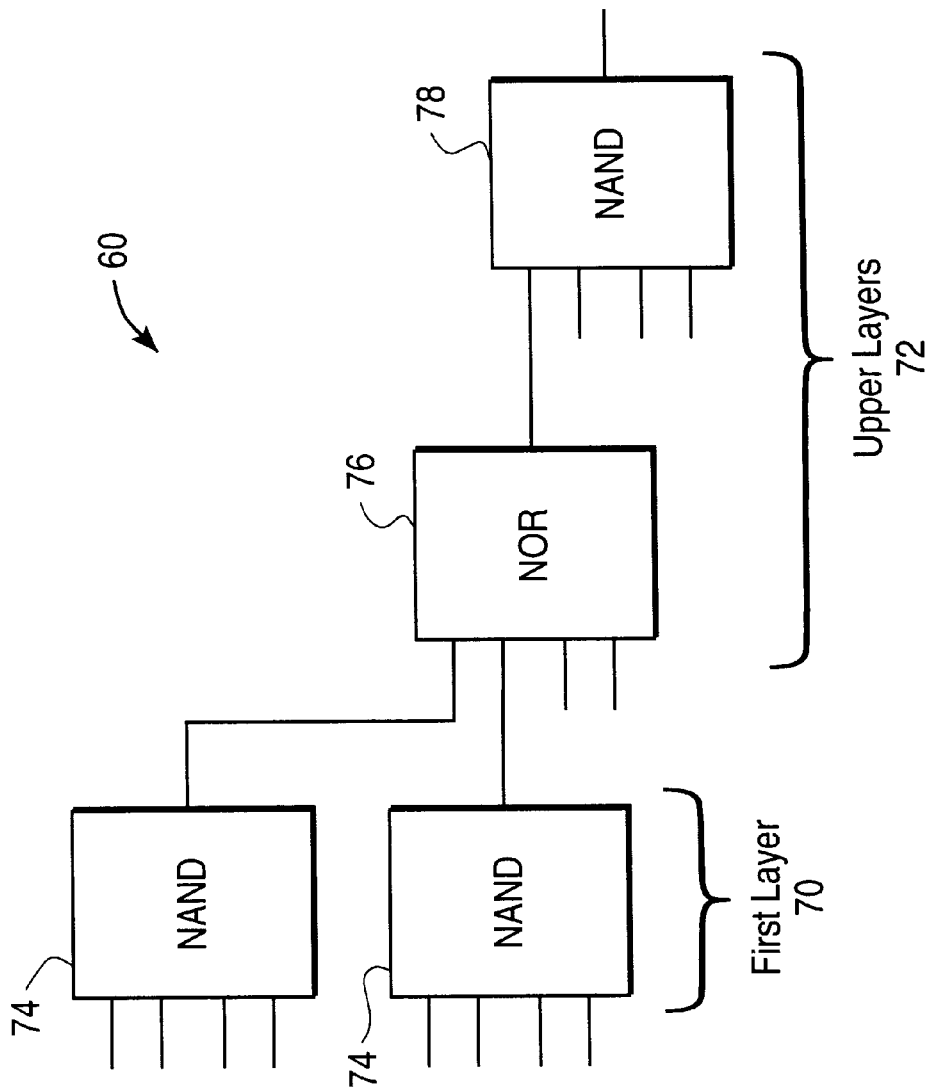
FIG. 3 is a block diagram illustrating an embodiment of a wide AND gate in accordance with the invention.

The CAM memory cell in accordance with the invention solves the problem of the match line power dissipation. The solution to the match line power dissipation means that the density of the memory cells in the CAM in accordance with the invention (and hence the total storage capacity) may be increased and the speed of the CAM is also increased dramatically. To accomplish this, a new CAM cell architecture providing numerous advantages over a conventional CAM cell is provided in which the wired ANDing of the conventional compare cells and the match line is replaced by a wide AND gate, as described below. The wide AND eliminates the pre-charge and pull-up functions normally necessary to perform a match, which reduces the power dissipation. The wide AND also improves the match time and the overall speed of the CAM since the match time is limited by the speed of the wide AND gate rather than the power limitations imposed by the conventional wired AND. The wide AND gate may use CMOS transistors so that the wide AND gate consumes no power when the inputs to the wide AND gate do not change. The fanout in the wide AND gate is one output which further improves the match speed. The layered architecture of the wide AND gate also reduces the power dissipation of the match function. When a four input logic gate is used to form the first layer of the wide AND gate function, as shown in FIG. 3, the output of the first layer gate will only change state for one of sixteen possible match inputs. This low switching activity in the mid and upper layers of the wide AND gate serve to further reduce power dissipation. The layout of the wide AND gate is arranged so that the transistors of the wide AND gate are geographically distributed throughout multiple individual cells of the CAM as described below. This minimizes routing problems and affords a more compact memory.

The new CAM cell structure may also include compare cell transistors which are implemented using a CMOS process. This further reduces power consumption and improves the speed/size trade-off. The new CAM cell structure may be used to improve all conventional CAM devices, such as single port CAMs, CAM devices with individual bit masking and multi-port CAM devices. Each of these CAM devices with the new CAM cell structure will be described below. Now, the CAM structure in accordance with the invention which solves the problems with the conventional CAM structure will be described.

Figure 2:
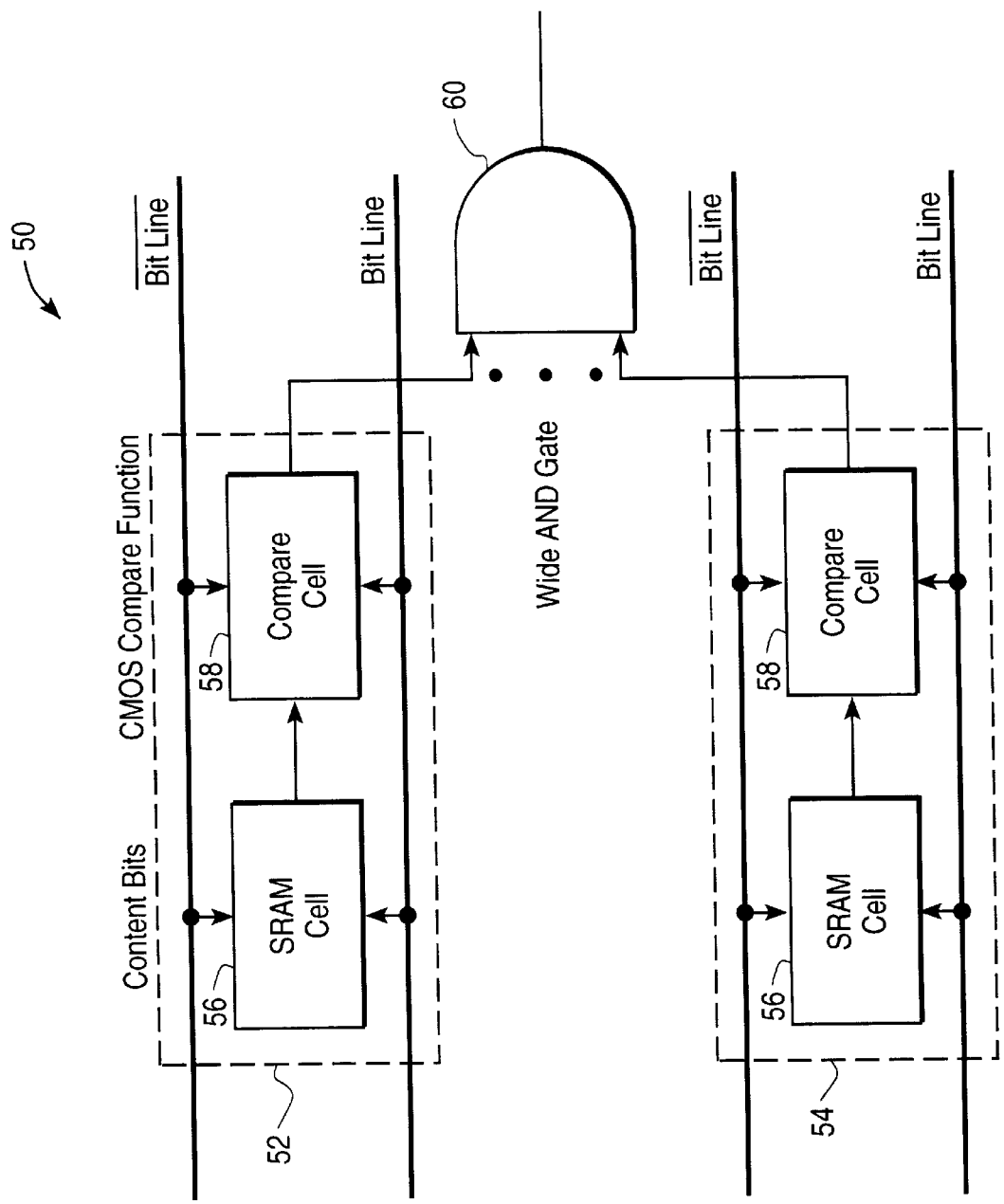
FIG. 2 is a block diagram illustrating a content addressable memory (CAM) in accordance with the invention.

FIG. 2 is a diagram illustrating a CAM device 50 in accordance with the invention. For purposes of this description, the CAM cell is described in the context of a single port CAM, although the CAM cell may also be used in other types of CAM devices, such as dual port CAM devices, event co-processors or database co-processors, as described below. The CAM 50 shown includes a first CAM cell 52 and a second CAM cell 54. The CAM in accordance with the invention includes a plurality of CAM cells, but only two CAM cells are shown here for purposes of clarity. As shown, each CAM cell 52, 54 may include a typical six transistor SRAM memory cell 56 similar to that of the conventional CAM device and a new, improved compare cell 58 which are connected together. The memory cell and the compare cell of each CAM cell are both connected to the differential bit lines (Bitline and $\overline{\text{Bitline}}$). The memory cell 56 operates in a similar manner to the memory cell in the conventional CAM and therefore will not be described here. The compare cell 58, as described above generally compares the bit value in the associated memory cell with the bit value on the differential bit lines (representing the value of the corresponding bit that is being matched to the values in the CAM) and outputs a high signal if the bits match. The outputs of the compare cells 58 in the CAM may be fed into a wide AND gate 60 having as many inputs as there are cells in the memory as will be described below with reference to FIG. 8. If the signals on all inputs of the wide AND gate are high (i.e., all bits of the compare register and the memory contents match), the wide AND gate may generate a high signal which indicates a match of the register value and the memory contents so that the address of the matching memory location may be returned to the outside world. The details of the wide AND gate will be described below.

Figure 4:
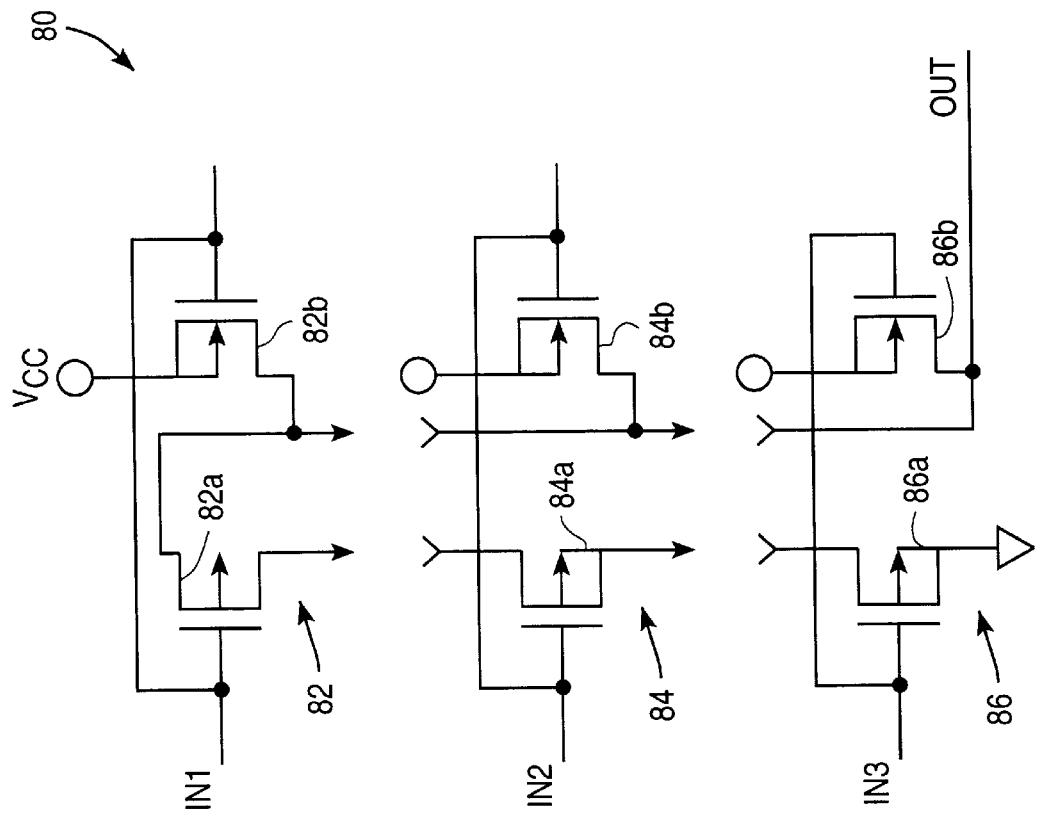
FIG. 4 is a block diagram illustrating a distributed NAND gate which may be used in the wide AND gate.

The reading and writing of data into and out of the CAM in accordance with the invention occurs in a similar manner to the reading and writing of data into and out of the conventional CAM cell and will not be described here. To compare the bit in the memory cell with the bit of the compare register, the compare cell 58, which will be described in more detail below with reference to FIG. 4, compares the bit in the associated memory cell with the bit lines (the bit lines contain the compare register bit) and generates an output (e.g., match or no match) which is fed into the wide AND gate 60. Due to the fact that the compare cells are not wire ANDed together as with conventional CAM devices, the transistors of the compare cells that do not match do not dissipate power.

The CAM cell 50 in accordance with the invention provides numerous advantages. First, due to the wide AND gate architecture, the match line power dissipation problems of conventional CAM devices are eliminated. In addition, the overall size of the CAM is reduced since the size of each CAM cell is reduced, as described below, while the speed of the CAM device is increased since the match time speed depends on the speed of the wide AND gate only. In addition, the use of CMOS transistors to implement the wide AND gate and the compare cell as described below further reduces the power dissipated by the CAM device. Now, the wide AND gate will be described in more detail.

FIG. 3 is a block diagram illustrating an embodiment of the wide AND gate 60 in accordance with the invention. As described above, the wide AND gate permits the outputs from each compare cell for a particular piece of stored data to be combined together to compare the bits of the piece of data with the bits of a match word. The wide AND eliminates the power dissipation problems of typical wired AND gates used in typical CAM devices. During a comparison, the wide AND gate generates a high signal only when all bits in the CAM device match all bits in the match word. A CAM may have a plurality of wide AND gates. For example a 4096 location CAM device may have 4096 wide AND gates. The wide AND gate also performs faster matches since the match time depends solely on the speed of the wide AND gate.

To form the wide AND 60 gate, one or more different geographically distributed logic gates (e.g., not AND logic gates (NANDs) and not OR logic gates (NORs)) may be connected together in an alternating pattern to form a wide AND (or wide NAND) gate with many inputs and one output. In accordance with the invention, each individual logic gate in the wide AND may have a limited number of inputs and then the individual logic gates may be stacked together as shown in FIG. 3. In addition, the logic gates of the wide AND may be distributed throughout the CAM device layout, as described below with reference to FIG. 8, so that for each CAM cell, the wide AND does not require a large number of transistors. In the example shown in FIG. 3, the wide AND may include a first layer of logic gates 70 which are associated with individual CAM cells and one or more upper layers of logic gates 72 which combine the outputs of the first layer of logic gates together to form the wide AND output. In this example, the first layer and one upper layer are shown, but the invention is not limited to only a single upper layer. In this example, the first layer 70 may comprise one or more NAND logic gates 74 which output a high signal most of the time except when all of the inputs of the NAND gate are high. The upper layer 72 of the wide AND may include a NOR logic gate 76 whose inputs are connected to the outputs of the NAND gates 74 from the first layer. The NOR logic gate generates a high output signal when none of its inputs are high or when all inputs are high. The upper layer may also include a NAND gate 78 whose inputs are connected to the outputs of the NOR gates 76. The output of the NAND gate 78, in this example, is the output of the wide AND gate. Thus, the logic of the wide AND gate in accordance with the invention is distributed throughout one or more layers of NAND and NOR gates which means that the NAND and NOR gates which make up the wide AND may be located closer to the CAM cell with which it is associated. The wide AND also eliminates the wired AND and the match line structures in a conventional CAM device since the wide AND gate performs the function of the wired AND gate and the match lines. This significantly reduces the power dissipation of the CAM device in accordance with the invention. The wide AND gate in accordance with the invention may use distributed NAND and NOR logic gates. An example of a distributed NAND gate which may be used in the wide AND in accordance with the invention will now be described.

FIG. 4 is a block diagram illustrating an example of a three-input distributed NAND gate 80 of the type which may be used in the wide AND gate (NAND 74 or NAND 78) of the invention. In particular, this distributed NAND gate, or a distributed NOR gate (not shown), may have separated transistor pairs 82, 84, 86. Each transistor of a pair may have a common input and each transistor pair may be located near the input source to reduce the routing of the signals. In adddition, in this distributed configuration, fewer signal lines are needed to connect the transistor pairs together. The distributed NAND gate 80 may thus include a first pair of transistors 82 (comprising an NMOS transistor $82_a$ and a PMOS transistor $82_b$ to form a CMOS transistor pair) whose inputs are connected to a first input (IN1) of the NAND gate, a second CMOS transistor pair 84 comprising transistors $84_a$ and $84_b$, whose inputs are connected to a second input (IN2) of the NAND gate, and a third CMOS transistor pair 86 comprising transistors $86_a$ and $86_b$, whose inputs are connected to a third input (IN3) of the NAND gate. As shown, both transistors in the transistor pairs 82–86 may be physically located near the input signal (IN1, IN2 or IN3) to reduce the routing of the input signals.

Within each transistor pair, the gates of the NMOS and PMOS transistors $82_a$, $82_b$, $84_a$, $84_b$, $86_a$, $86_b$ are connected together and connected to the input signals, IN1–IN3. The drain of the PMOS transistor and the source of the NMOS transistor of a CMOS pair are connected to the output signal line while the source of each PMOS transistor is connected to a supply voltage, Vcc. The drain of each NMOS transistor is connected to the source of the NMOS transistor of the next pair, and the drain of the last NMOS transistor $86_a$ is connected to ground.

As shown, to connect the transistor pairs together only two signals lines (an output and a series connection line) are required. In particular, the output signal from each transistor pair is connected together and the output of the last transistor pair 86 forms the output of the NAND gate. A series connection signal connects the sources and drains of the NMOS transistors $82_a$, $84_a$, $86_a$ together. The advantages of this distributed NAND gate are described above. The structure of the distributed NOR is similar and will not be described here. Now, an example of the compare cell in accordance with the invention will be described.

Figure 5:
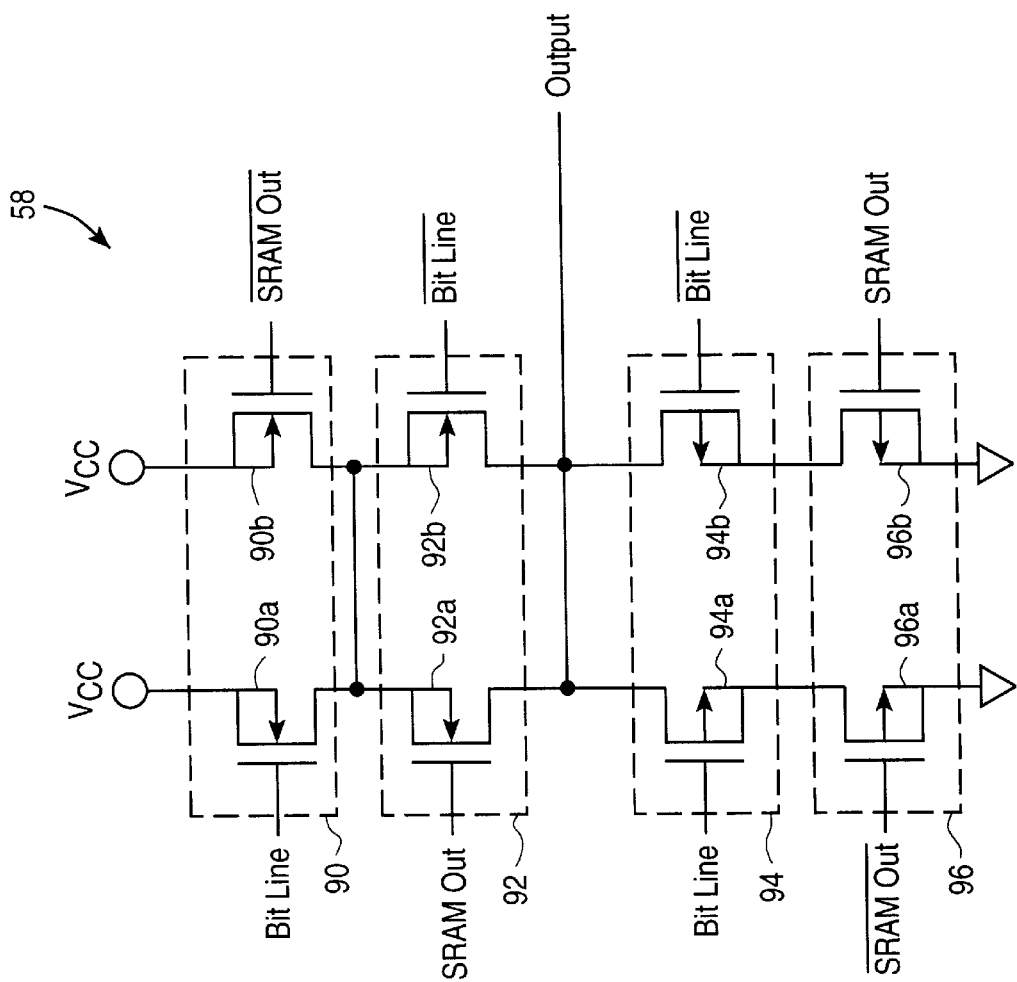
FIG. 5 is a block diagram of the compare cell in accordance with the invention.

FIG. 5 is a block diagram of a preferred form of the compare cell 58 in accordance with the invention. To reduce the power dissipation of the compare cell 58, a CMOS structure is used instead of the NMOS structure typically used in conventional CAM device compare cells. The compare cell 58 may therefore include one or more PMOS transistors coupled to one or more NMOS transistors. The compare cell may receive four inputs (two signals) from the compare register (BitLine and $\overline{\text{BitLine}}$) and four inputs (two signals) from the memory cell (SRAM Out and $\overline{\text{SRAMOut}}$). It compares the bit value in the compare register to the bit value in the memory cell to determine whether a match exists.

In more detail, the compare cell 58 may include a first pair 90 of PMOS transistors $90_a$ and $90_b$ whose gates are connected to the BitLine signal and the $\overline{\text{SRAMOut}}$ signal, respectively, and a second pair 92 of PMOS transistors $92_a$, $92_b$ whose gates are connected to the SRAM Out signal and the $\overline{\text{BitLine}}$ signal, respectively. These two pairs 90, 92 of PMOS transistors pull the output signal high when either SRAM Out and BitLine signals are both high or when the SRAM Out and BitLine signals are both low (which causes high $\overline{\text{SRAMOut}}$ and $\overline{\text{BitLine}}$ signals to be generated). In these cases, the bit in the memory cell matches the bit from the compare register on the BitLine and the output of the compare cell is high indicating that a match of that bit has occurred. The output of the compare cell, as described above, may then be fed into the wide AND gate.

The compare cell 58 also includes a first pair 94 of NMOS transistors $94_a$, $94_b$ whose gates are connected to the BitLine and $\overline{\text{BitLine}}$ signals, respectively, and a second pair 96 of NMOS transistors $96_a$, $96_b$ whose gates are connected to the SRAM Out and $\overline{\text{SRAMOut}}$ signals, respectively. These two pairs of NMOS transistors pull the output of the compare cell down low (connect the output to ground) when either the BitLine signal is high and the SRAM Out signal is low or when the BitLine signal is low and the SRAM out signal is high. Thus, when the two signals on the BitLine and SRAM Out lines are different (i.e., no bit match), the output of the compare cell is low indicating that a match did not exist between the values of the bits in the memory cell and in the compare register. Now, the routing and layout of the CAM device in accordance with the invention will be described.

Figure 6:
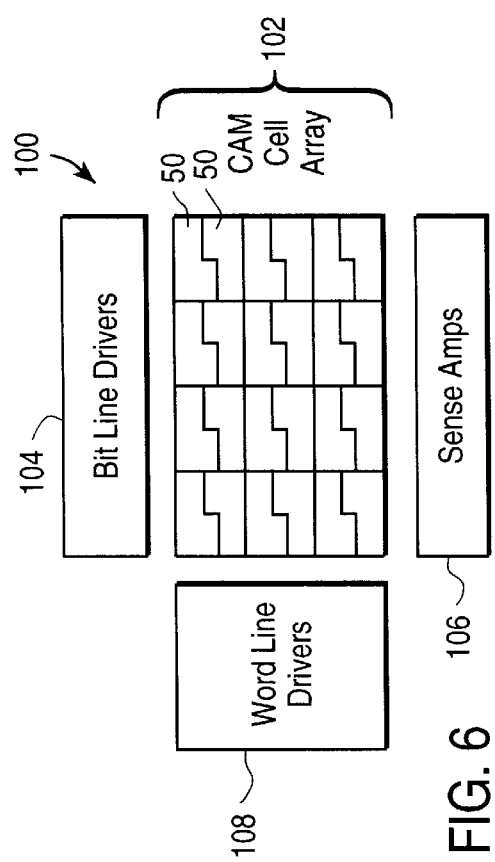
FIG. 6 is a diagram illustrating the routing and layout of the CAM device in accordance with the invention.

FIG. 6 is a diagram; illustrating the routing and layout of a CAM device 100 in accordance with the invention. As shown, the CAM device 100 may include an array 102 of CAM cells 50 which will be described below in more detail.

The CAM device 100 may also include a bank of bit line drivers 104, a bank of sense amplifiers 106 and a bank of word line drivers 108 adjacent to the array of CAM cells. Briefly, the bit line drivers, the sense amplifiers and the word lines permit data to be read out of or written into the CAM device. The operation of the bit line drivers, the sense amplifiers and the word line drivers are well known and will not be described here. As shown, the bit lines and the inverted bit lines may run vertically between the bit line drivers and the sense amplifiers. The wide AND gate connections may run horizontally within portions of each CAM cell 50 as described below and the word lines may run horizontally from the word line drivers across the array of CAM cells. Now, the routing and layout of a CAM cell 50 using a sea of gates array will be described.

Figure 7:
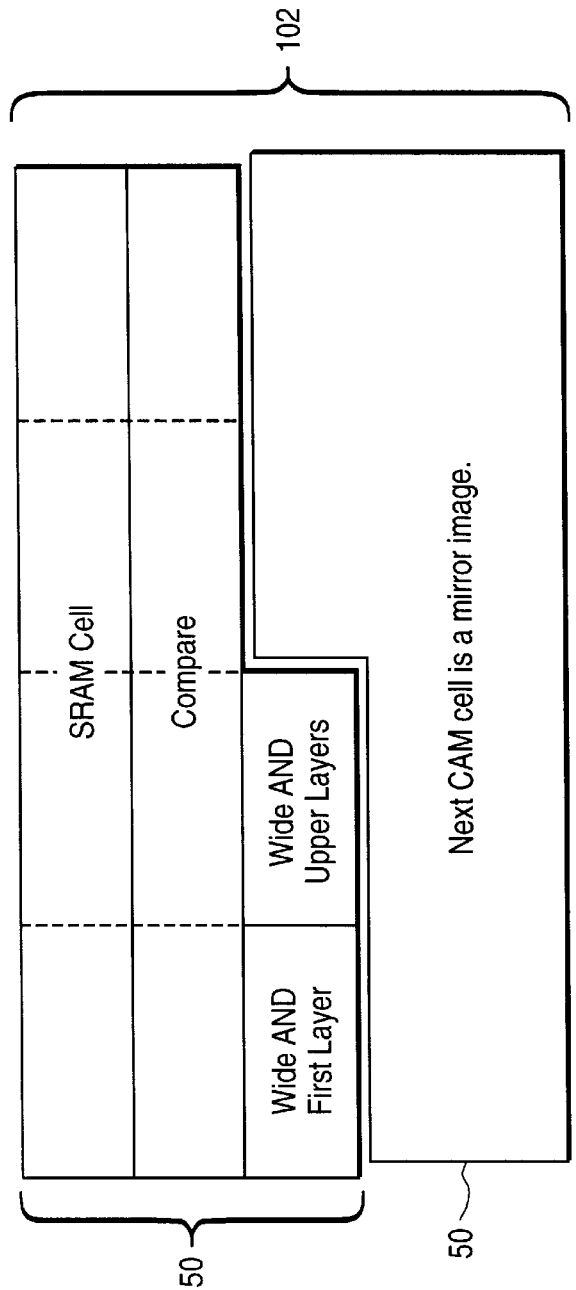
FIG. 7 is a diagram illustrating the layout of a single CAM cell in accordance with the invention embodied in a sea of gates array.

FIG. 7 is a diagram illustrating the layout of several CAM cells 50 in the array 102 in accordance with the invention using a "sea of gates" type array. A "sea of gates" array refers to a particular type of gate array which may be used to implement the CAM device. In one embodiment, a sea of gates array manufactured by IBM using 0.18 CMOS gates may be used. In this diagram, each dotted box in the CAM cell contains one pair of transistors. For the CAM cell in accordance with the invention, there may 6 SRAM memory cell transistors (4 boxes), 8 compare cell transistors (4 boxes) and about 2.5 wide AND transistors (2 boxes) since the wide AND is distributed throughout the CAM device as shown in the diagram. Thus, the wide AND is shown having two transistors for the first layer and two transistors for the upper layers of the wide AND. For the next CAM cell 50, it may be the mirror image of the first CAM cell so that the CAM cells fit together as shown. Due to the layout shown, most of the transistors in the sea of gates array are utilized which leads to higher packing densities than conventional CAM devices.

In total, each CAM cell may require about 16.5 CMOS transistors or a total of 10 transistor pairs. Using the 0.18 micron IBM CMOS technology sea of gates array which can support 12 million routeable gates, the invention enables a 2 Mbit CAM device to be produced. This CAM device comprises eight times as many CAM cells as currently known state of the art CAM devices. A comparable size CAM device can not be built with a conventional CAM cell because of the excessive power dissipation of the prior art design. Now, the layout and distribution of the wide AND gate within the CAM device will be described.

Figure 8:
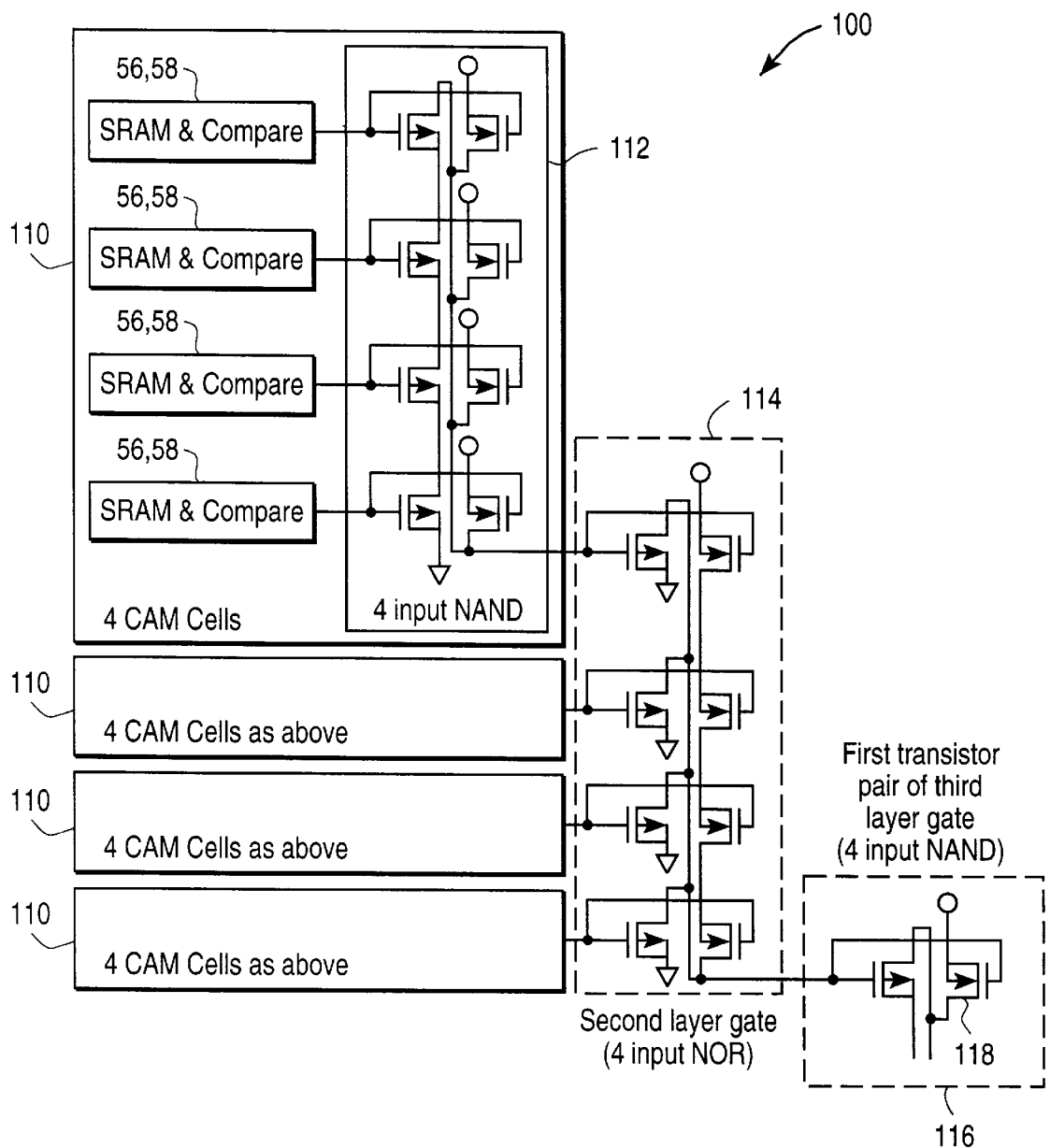
FIG. 8 is a diagram illustrating the layout and routing of the wide AND gate within the CAM device in accordance with the invention.

FIG. 8 is a diagram illustrating the layout, routing and distribution of the wide AND gate within the CAM device 100. For purposes of illustration, four blocks 110 containing four CAM cells are shown. To help illustrate the distribution of the wide AND gate, one of the blocks 110 has been expanded to show the transistors of the wide AND gate. As shown, each block may contain four CAM cells and each CAM cell may contain a memory cell 56 and a compare cell 58 which are shown together diagramatically as a single block in this diagram.

The first layer of the wide AND gate, a 4-input NAND gate 112 may have inputs which are respectively connected to the outputs of the compare cells 58 for four CAM cells. Thus, each CAM cell may contain two transistors of the 4-input NAND. Instead of the structure shown, a wide AND structure which begins with a NOR gate may also be used. Thus, the 4-input NAND 112 determines if the four bits in the four CAM cells to which it is attached match the corresponding four bits in the compare register. Thus, every four CAM cells are connected to a first layer of the wide AND gate.

Starting with the second layer of the wide AND gate, the transistors of the second and further layers are geographically distributed across the CAM device. For example, for the second layer, one transistor pair of the second layer of the wide AND gate (a 4-input NOR 114 in this example) is located adjacent to every fourth CAM cell. Thus, as shown in the FIG. 8, the second layer NOR gate 114 may have each of its inputs connected to the output of the four 4-input NAND gates (not shown) for the four blocks 110 so that the inputs of the NOR gate are effectively connected to 16 CAM cells. The third level 116 of the wide AND gate, of which only one transistor pair 118 of a NAND gate is shown, is also geographically distributed so that a transistor pair is located adjacent to every sixteenth CAM cell as shown. For the fourth layer of the wide AND, a transistor pair may be located adjacent to every sixty-fourth CAM cell and so on. In this manner, the transistors of the wide AND gate are distributed throughout the CAM device which reduces the routing for the wide AND gate associated with each CAM cell. Additional reductions in power dissipation are achieved by this design due to the very short routing of the lower layers of the wide AND gate and very low switching activity of the upper layers of the wide AND gate. Now, a CAM device which may include individual bit masking will be described.

Figure 9:
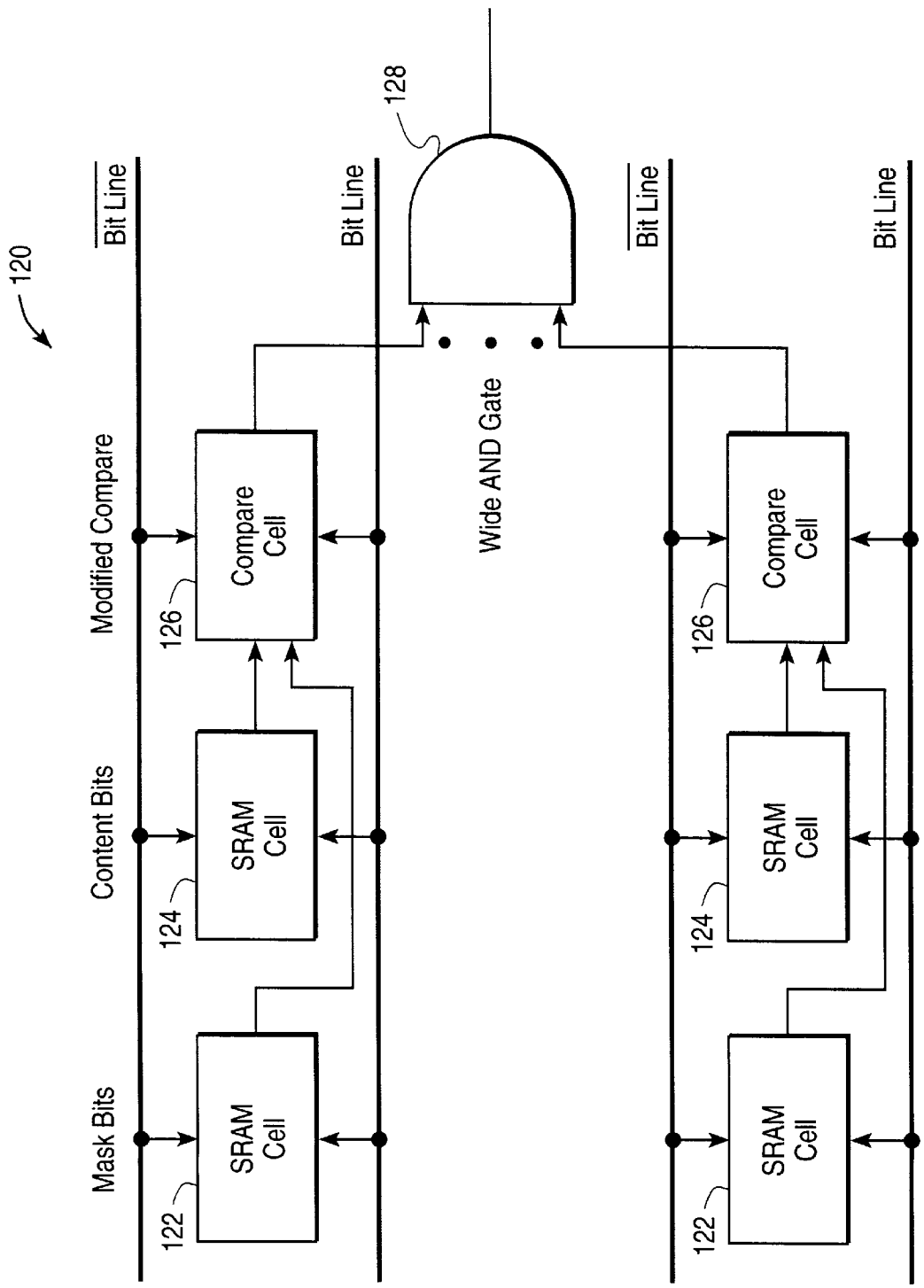
FIG. 9 is a block diagram of a CAM device in accordance with the invention which includes individual bit masking.

FIG. 9 is a block diagram of a CAM device 120 in accordance with the invention which includes individual bit masking. The wide AND and CMOS compare cell structure as described above may also be used with a CAM device having individual bit masking to provide the same advantages, such as less power dissipation, faster speed and higher density CAM cells. With individual bit masking, each CAM cell may have a second SRAM bit added which may be used to enable/disable the compare function of a particular bit as will now be described. Then, a CMOS compare cell with a mask in accordance with the invention is described.

The CAM device 120 with individual bit masking may include a first memory cell 122 into which mask bits are stored and a second memory cell 124 into which the bits of the entries of the CAM are stored. The CAM device may also include a novel two-input compare cell, to be described in more detail below, with mask 126 which compares the bit of the compare register with the value stored in the second memory 124 unless the mask bit is set in the first memory 122. To perform these comparisons, the outputs of the two memory cells are fed into the compare cell 126. In addition, each memory cell and the compare cell may also be connected to the bitline and inverted bitline signals. The outputs of the compare cells 126 may be connected to a wide AND gate 128 as described above. Thus, except for the additional first memory 122 for storing the mask bit and the compare cell with mask 126, this CAM device 120 operates in a similar manner to the CAM device described above and therefore the operation will not be described here. Now, the compare cell with mask in accordance with the invention will be described.

Figure 10:
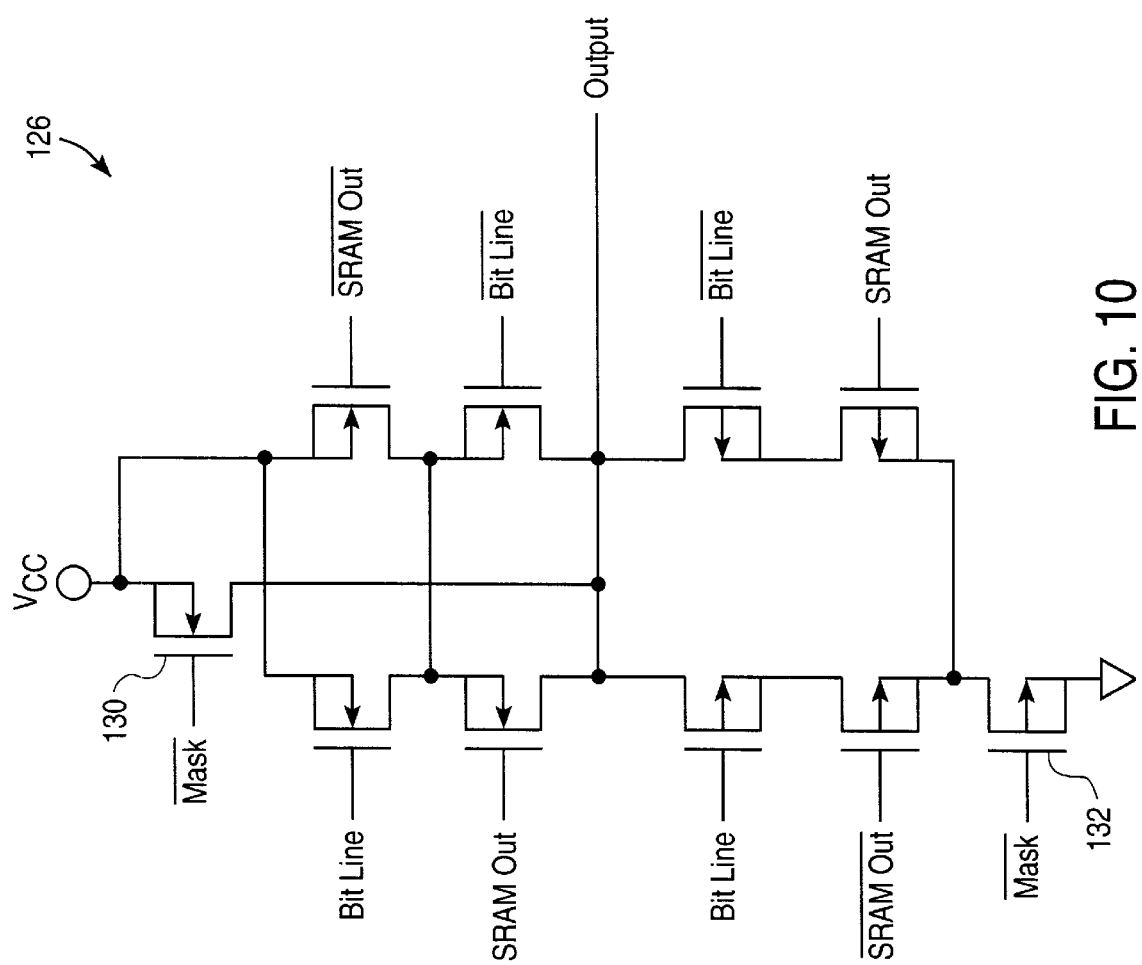
FIG. 10 is a block diagram illustrating a CMOS compare cell with mask in accordance with the invention.

FIG. 10 is a block diagram illustrating the CMOS compare cell with mask 126 in accordance with the invention. The compare cell may include the bitline and inverted bitline signals, the output from the memory cell (SRAM Out) and the inverted output of the memory cell ($\overline{\text{SRAMOut}}$) and an inverted mask signal ($\overline{\text{Mask}}$). The basic structure and operation of this compare cell is similar to the operation of the compare cell described above and therefore will not be described here. However, in addition to the decision logic to determine if a match has occurred, the compare cell 126 may include a first transistor 130 and a second transistor 132 whose gates are driven by the inverted mask signal. In operation, if the mask function is asserted (a low signal), the output of the compare cell is high indicating that a match has occurred so that the masked off bit does not affect the matching of the rest of the bits. The first transistor 130 may pull the output of the compare cell to a high signal while the second transistor 132 may disable the pull down path for the compare so that the compare cell cannot generate a low signal regardless of the values of the bits. Now, a dual port CAM device in accordance with the invention will be described.

Figure 11:
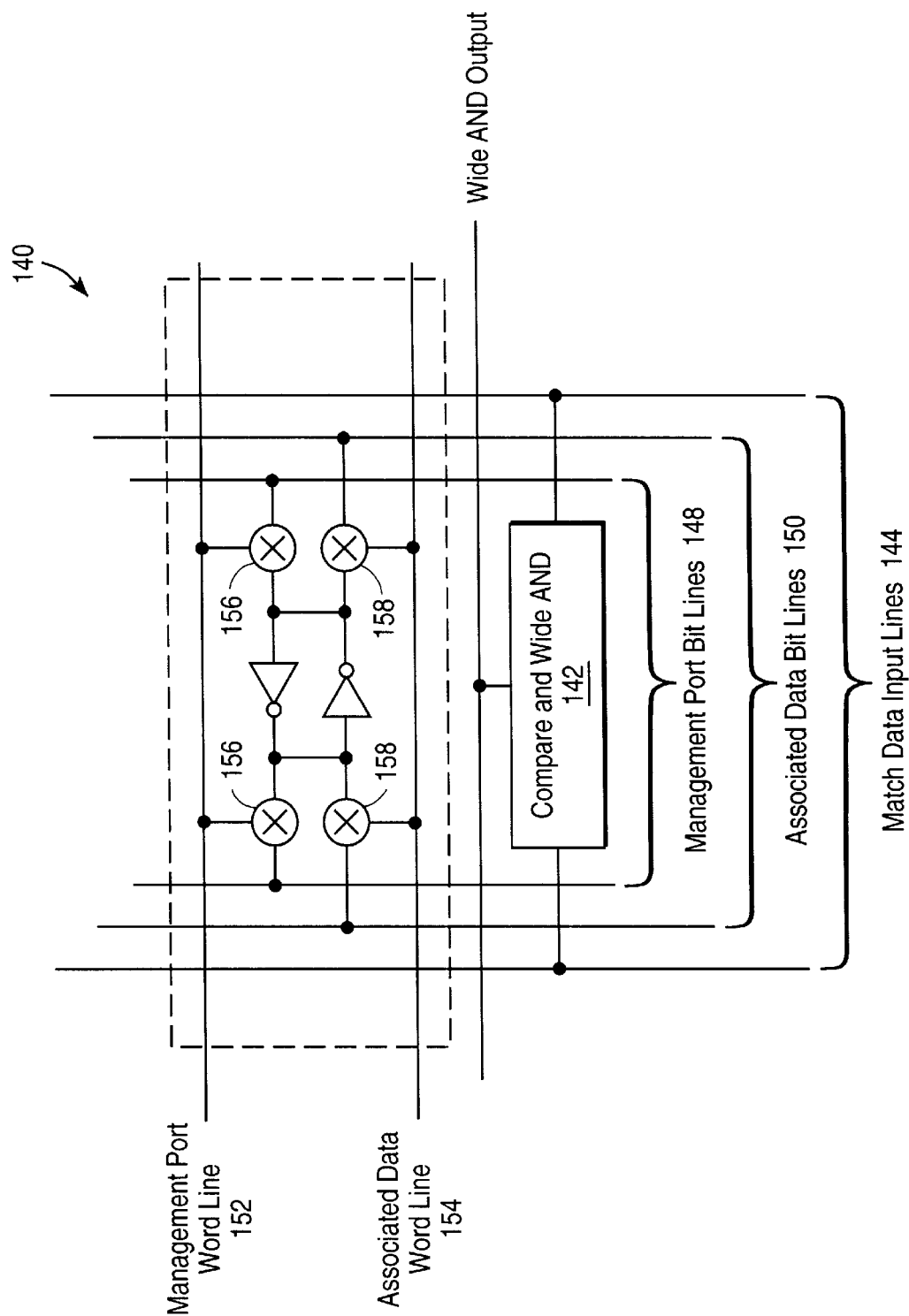
FIG. 11 is a block diagram illustrating an example of a dual port CAM device in accordance with the invention.

FIG. 11 is a block diagram illustrating an example of a dual port CAM device 140 in accordance with the invention. It is desirable to provide two different access to the CAM. In particular, there may be match port access and management port access. The match port access permits a match input to be fed into the CAM, the match output received from the CAM and other match port control signals may be communicated through the match port. The management port may permit management of the address bus and the data bus in the CAM or management of the port control signals. Thus, a CAM device with two ports permits the CAM access and management access to be separated which permits the CAM to be used, for example, to control a high speed device, such as an asynchronous transfer mode (ATM) or Ethernet switch, independent of the control processors. In accordance with the invention, the CAM cell in accordance with the invention may be applied to a dual-port CAM device which may have separate management and match ports or multiple management and/or multiple match ports as will be described below.

Returning to FIG. 11, the dual port CAM device 140 may include the CAM cells which may include the compare and wide AND circuitry 142. The compare and wide AND circuitry may be connected to match data input lines 144. To control the CAM device, there may be management logic 146 which may be connected to management port bit lines 148. In addition, the management logic 146 may also be connected to a management port word line 152. In particular, the management port word line may control a pair of transfer gates 156 and the associated data word line may also control another pair of transfer gates 158. In this manner, management port access to the CAM device may be provided.

Figure 12:
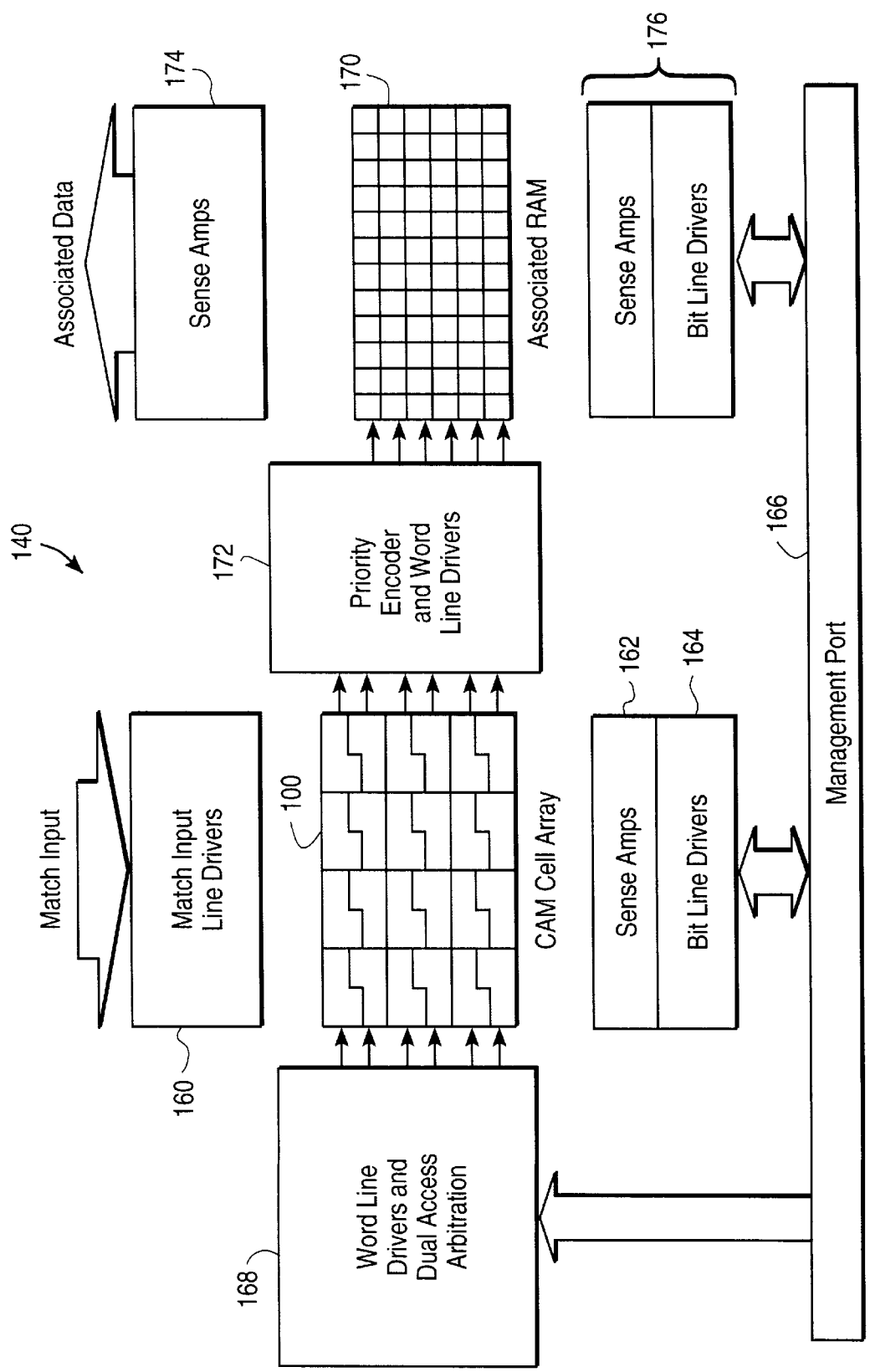
FIG. 12 is a block diagram more details of the dual port CAM device of FIG. 11.

FIG. 12 is a block diagram illustrating more details of the dual port CAM device 140 of FIG. 11 including the CAM cell array 100 as shown in FIG. 6. The dual port CAM device 140 may also include match input line drivers 160 which accept match input to the CAM device 140. There may also be sense amplifiers 162 and bit line drivers 164. The output of the bit line drivers may be connected to a management port 166. The management port 166 may also be connected to an array of word line drivers and dual access arbitrators 168. The dual access arbitrators determine the behavior of the CAM when the management port and the match port both access the same CAM. The output of the CAM cell array 100 may be connected to a priority encoder for multiple match resolution and word line drivers 172. The RAM 170 may include typical sense amplifiers 174 which output the associated data and bit line drivers 176. The bit line drivers 176 may also be connected to the management port 166. Thus, using the management port 166, the user of the dual port CAM device 140 may control the operation of the CAM as well as the operation of the RAM. Now, a CAM with multiple match ports and a management port will be described.

Figure 13:
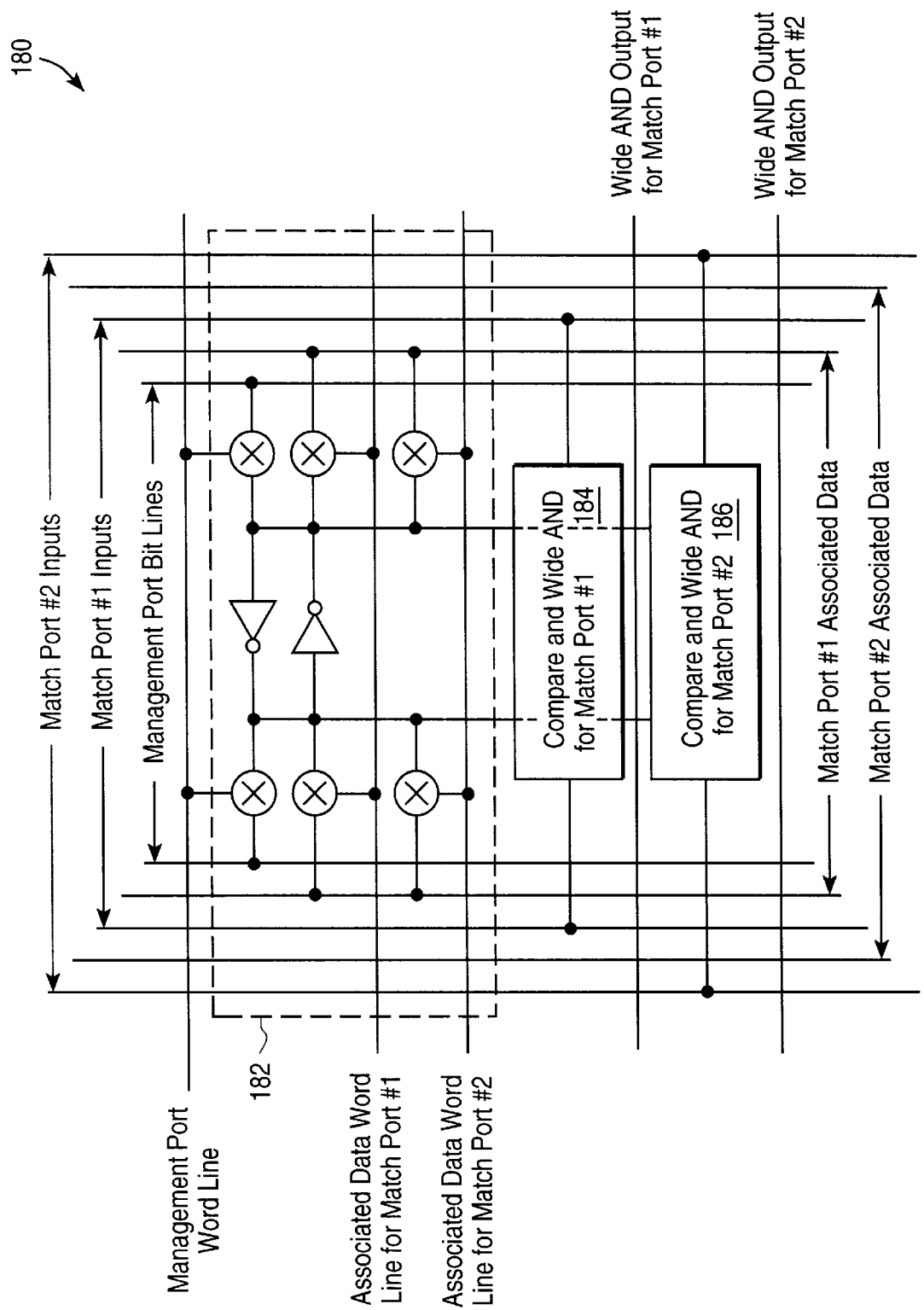
FIG. 13 is a block diagram illustrating an example of a CAM device having multiple match ports in accordance with the invention.

FIG. 13 is a block diagram illustrating an example of a CAM device 180 having multiple match and/or management ports in accordance with the invention. In this example of the CAM device 180, there may be two match ports so that different matches to different bit patterns may be performed at the same time. To accomplish this, there may be management logic 182 which controls access to the CAM cell array (not shown), the compare and wide AND gate for the first match port 184 and the compare and wide AND gate for the second match port 186. As shown, there may be various control lines connected to the management logic and the compare and wide AND gates to control access to the various portions of the CAM device 180. The operation of these control lines and the transfer gates in similar to that described above with reference to FIG. 11 and will not be described here. Now, a CAM device in accordance with the invention which includes a RAM will be described.

Figure 14:
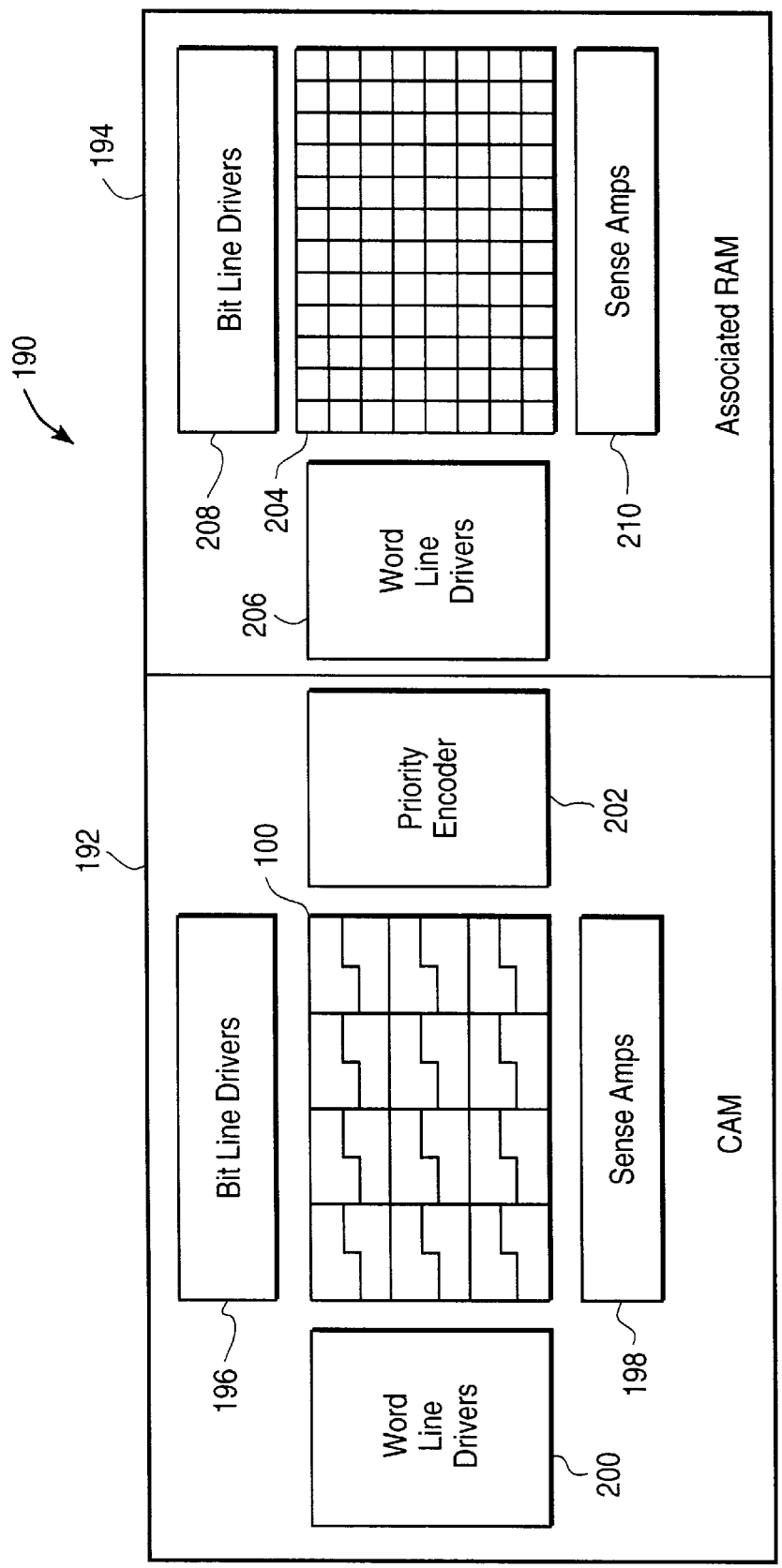
FIG. 14 is a block diagram illustrating a CAM device including RAM in accordance with the invention.

FIG. 14 is a block diagram illustrating a CAM device 190 including associated RAM in accordance with the invention. As shown, the CAM device 190 may include a CAM device 192 and an associated RAM device 194. The CAM device 192 may include the CAM cell array 100, an array of bit line drivers 196 opposite an array of sense amplifiers 198 and an array of word line drivers 200 opposite a priority encoder 202. The RAM device 194 may include a memory cell array 204, word line drivers 206, bit line drivers 208 and sense amplifiers 210. In this embodiment, the outputs of the priority encoder of the CAM device 192 drive the word line drivers 206 of the RAM 194. Now, a configurable CAM/RAM device in accordance with the invention will be described.

Figure 15:
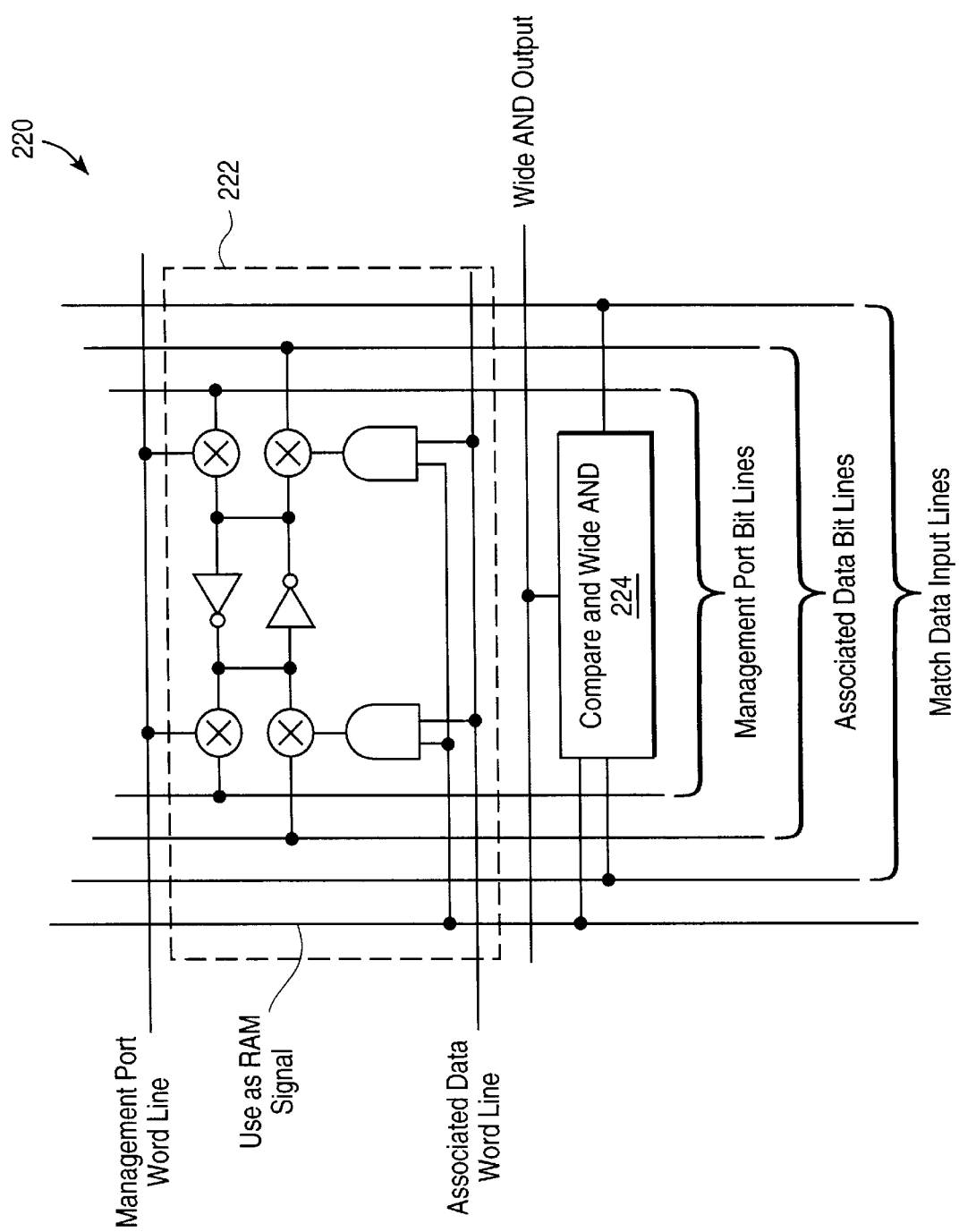
FIG. 15 is a diagram illustrating an example of a dual port configurable CAM/RAM cell in accordance with the invention.
Figure 16:
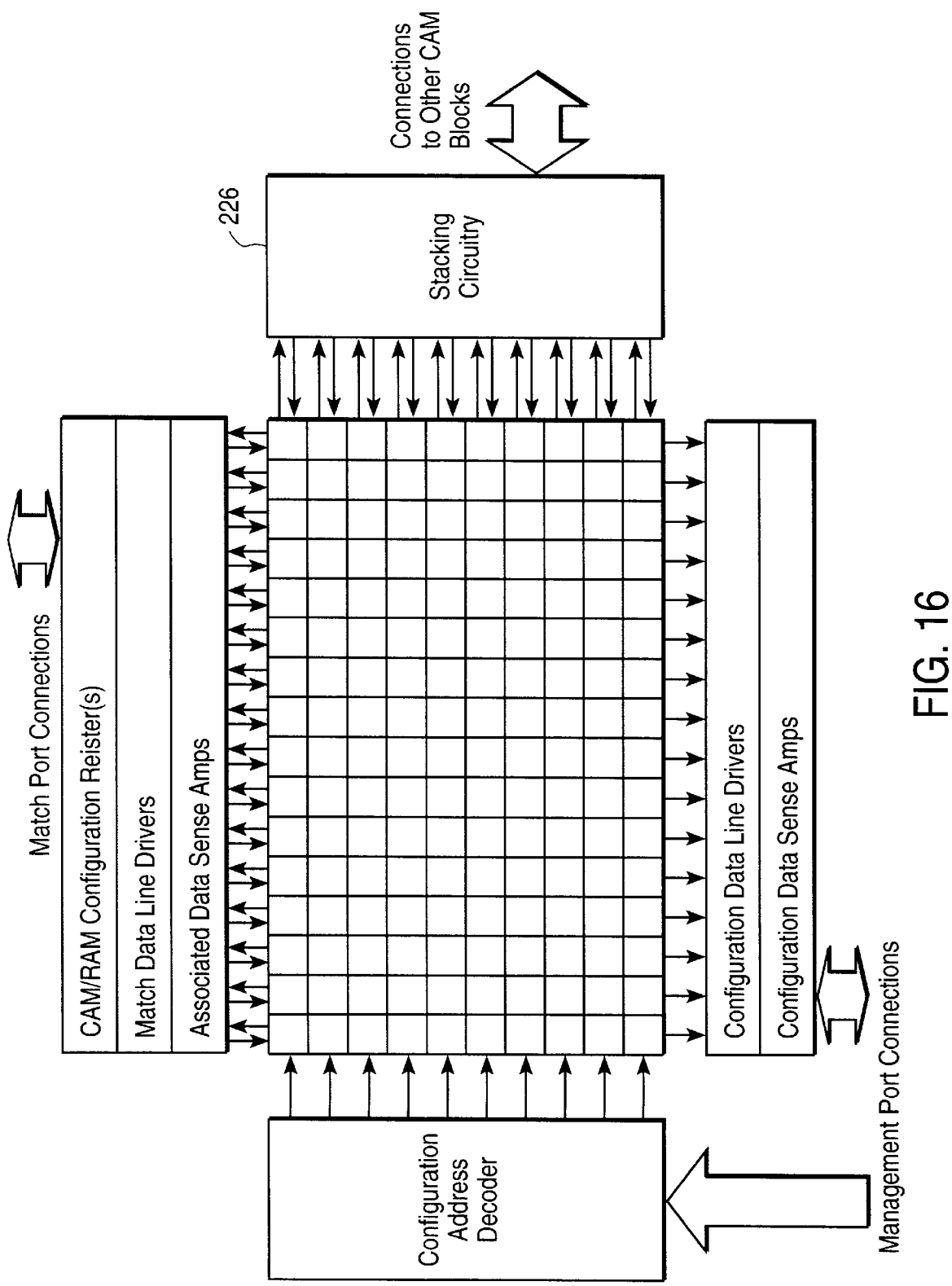
FIG. 16 is a diagram illustrating more details of the dual port configurable CAM/RAM of FIG. 15.

FIG. 15 is a diagram illustrating an example of a dual port configurable CAM/RAM device 220 in accordance with the invention and FIG. 16 is a diagram illustrating more details of the dual port configurable CAM/RAM. Conventional configurable CAM/RAM devices, as described in U.S. Pat. Nos. 5,383,146 and 5,706,224 which are incorporated herein by reference, disable the compare cell in certain CAM cells to provide the RAM storage so that the particular CAM cell cannot be used as a CAM cell. Another conventional CAM/RAM device uses transfer gates to programmably separate the conventional wired AND function into CAM and RAM subsections.

The CAM/RAM device 220 in accordance with the invention may permit each CAM cell to operate as either a CAM/associated data cell or as only an associated data cell. The CAM/RAM device 220 includes management logic 222 and a compare and wide AND circuit 224. This CAM/RAM device also includes the management control lines as described above which control the management logic. The CAM/RAM device 220 may also include "Use as RAM" signal which forces the output of the compare cell to be high (which disables the compare cell) and combined with the Associated Data World Line, controls the connection to the Associated Data Bit lines. More details of the CAM/RAM device 220 are shown in FIG. 16 including stacking circuitry 226 which comprises logic for cascading match lines for multiple blocks for greater width and depth devices. In particular, a programmable logic vendor may incorporate a small number of these blocks as a configurable CAM device so that four 1K×64 bit blocks may be cascaded to form a 4K×64bit CAM, a 2K×128bit CAM or a 1K×256bit CAM. The other circuitry shown in FIG. 16 is fairly typical for a configurable CAM/RAM device (See U.S. Pat. Nos. 5,583, 146 and 5,706,224) and therefore will not be described here. Now, the stacking circuitry 226 will be described.

Figure 17:
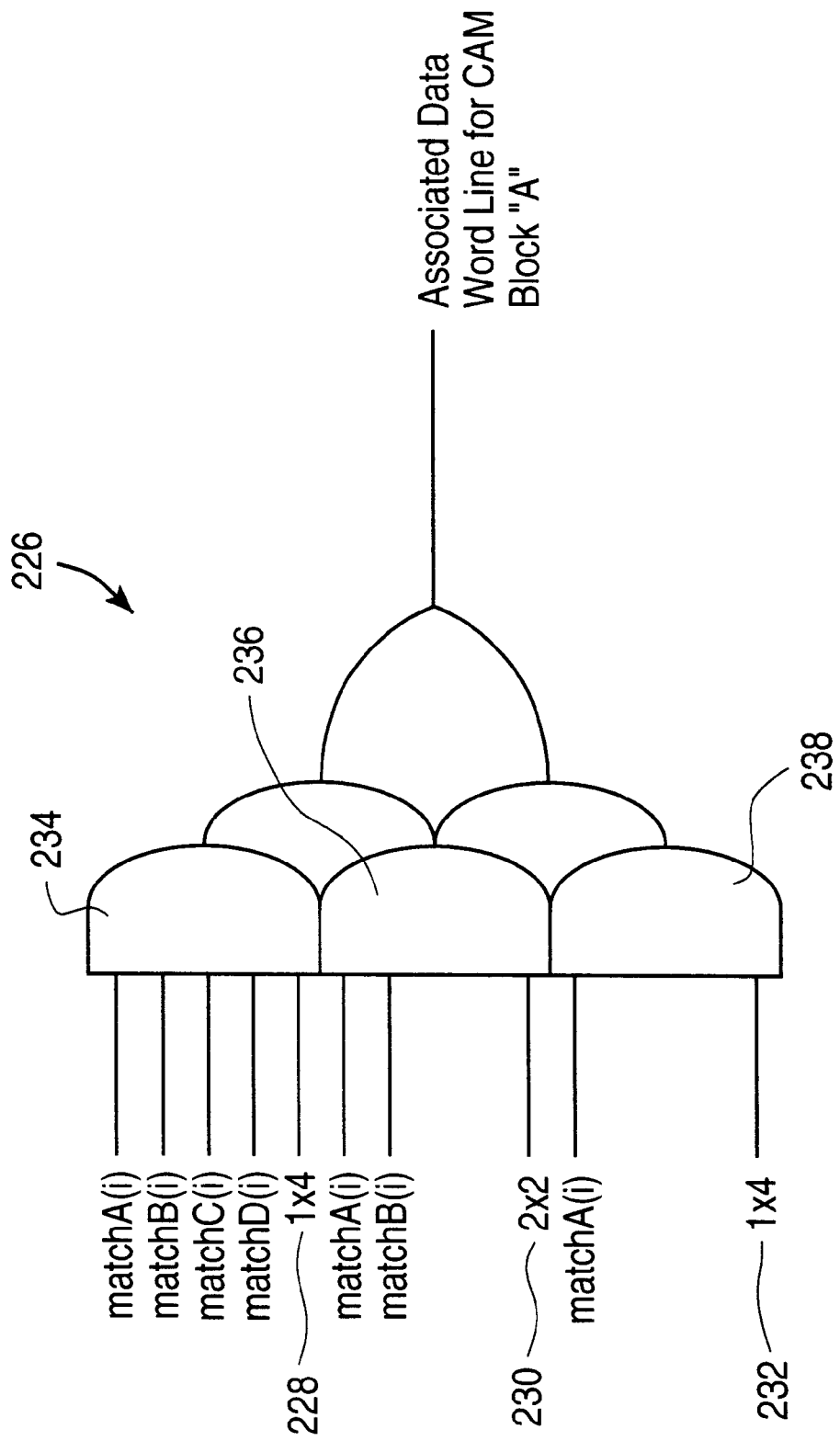
FIG. 17 is a diagram illustrating the stacking circuitry in accordance with the invention.

FIG. 17 is a diagram illustrating the stacking circuitry 226 in accordance with the invention. The stacking circuit permits the different configurations to be generated by combining the outputs of the wide AND gates. For purposes of this description, assume that there are four CAM blocks on a chip and these blocks are named "A"–"D". The wide AND gate output for the ith entry in CAM block A is match A(i). Thus, the possible configurations are 1×4 (widest possible entry), 2×2 and 4×1 (more shorter entries). For purposes of this illustration, the output for CAM block "A" only is shown, but there may also be stacking circuitry for the outputs of block B–D depending on the configuration. As shown, the stacking circuitry 226 may receive a 1×4 control signal 228, a 2×2 control signal 230 and a 4×1 control signal 232 as well as the match signals for the blocks A–D of the CAM. Thus, the stacking circuitry permits the reconfigurable CAM device to be either 1×4, 2×2 or 4×1 depending on the needs of the user. This results in a considerable economic advantage to the CAM manufacturer since a single CAM device may support a much larger number of different CAM applications whereas prior art CAM device have fixed line sizes.

To form the output signal when the CAM device has a 1×4 configuration, very wide entries may be matched. To accomplish this, the wide AND outputs for blocks A–D (matchA (i), matchB(i), matchC(i) and matchD(i) are combined together by an AND gate 234 with the 1×4 control signal so that, if the 1×4 control signal is active, the wide AND outputs for the blocks are ANDed together. Thus, a match of the entry only will occur if the bits in blocks A –D match the compare register bits so that an entry that is as wide as the four blocks is effectively formed. For the 2×2 configuration, the outputs of the wide AND gates for the first and second block (matchA(i) and matchB(i)) are logically ANDed together by an AND gate 236. Thus, when the 2×2 control signal is active, the outputs of block A and B are ANDed together so that a match occurs for block A if the bits in both A and B match. Similarly, the outputs of blocks C and D are also ANDed together which is not illustrated. For the 4×1 configuration, each output signal (matchA(i) is fed into an AND gate 138 with the 4×1 control signal so that none of the blocks are combined together to form a CAM with more entries which are shorter than the 1×4 or 2×2 configurations. Now, the CAM management in accordance with the invention.

All of the CAM device is accordance with the invention may include management functions within the CAM device so that an intelligent CAM device exists. In accordance with the invention, a per entry match inhibit bit may be provided which permits CAM entries to be individually disabled (match inhibit) and unused entries to be used as RAM. The management may also include a maintenance of the list of free CAM entries. The list maintenance permits the count of the free entries to be available to the user, all entries to be marked as free at power-up/reset and duplicate entry tests to be performed. Now, match resolution logic for the CAM in accordance with the invention will be described.

Figure 18:
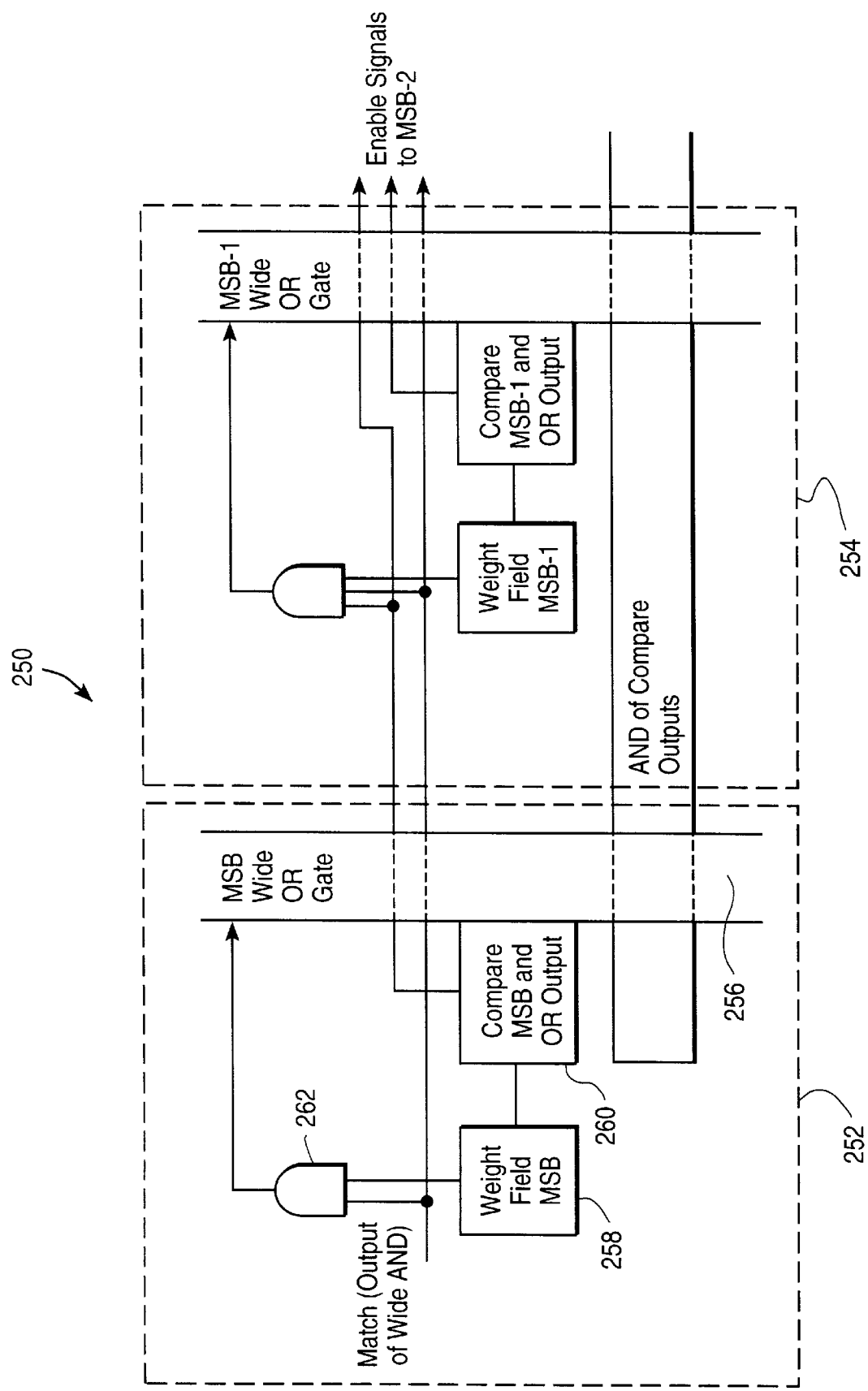
FIG. 18 is a diagram illustrating match resolution logic in accordance with the invention.

FIG. 18 is a diagram illustrating an example of match resolution logic 250. The match resolution logic resolves which matching entry in a CAM will be output by the CAM in response to a compare request when there are multiple entries in the CAM which match the compare register bits. Conventional CAM devices also include some type of match resolution, but conventional match resolution logic is slow and typically performs match resolution using a single method such as a best match. In accordance with the invention, weight based multiple match resolution logic may be used which may use CMOS implemented wide OR gates which provide the same advantages as the wide AND gates described above, such as increased speed and reduced power dissipation. The match resolution logic 250 may provide hierarchical match resolution. For example, if two or more entries have the same weight according to a first match criteria, a second match criteria may be applied to the two or more entries. The weights used to determine the matching entry may include, for example, a weight field stored along with each entry in the CAM array or the associated RAM indicating the priority of each entry, a length of the entry (similar to the longest match), a number of matching bits in each entry (similar to the best match) or the position of the entry in the CAM array (used to guarantee a unique weight exists for each entry). The structure of the match resolution logic and its operation will now be described.

In more detail, the match resolution logic 250 may include circuitry 252 associated with each memory cell in the CAM array. For purposes of this example, it is assumed that two or more entries each having a plurality of bits match. For illustration purposes, only the first two bits of the first potentially matching entry are shown. Thus, a most significant bit (MSB) of a matching entry may include the circuitry 252 and circuitry 254 may be associated with a next most significant bit of the matching entry. As shown, the most significant bits of each matching entry may be compared using a wide OR gate 256. Each memory cell in the CAM array may include a weight field store 258, a comparator 260 which compares the value in the weight field store to the output of the wide OR gate and an AND gate 262 which enables the match logic of the particular memory cell.

In operation, each matching entry will assert a most significant bit (MSB) from the weight field store 258 which is fed into the enable AND gate 262. For the most significant bit, the other input of the AND gate is always high so that the MSB is asserted at the input of the wide OR gate. Next, the comparator 260 compares the MSB of the weight to the output of the wide OR gate. If the two do not match (i.e., this particular matching entry loses the priority battle), the match resolution process is stopped since the comparator 260 outputs a low signal which disables the matching of the lower order bits. If the MSB of the match field and the output of the wide OR do match, then the comparator 260 outputs a high signal which enables the next lower order bit for match resolution (MSB-1 in this example) so that the next lower order bit may be compared to the output of the wide OR gate. For each matching entry, if the outputs of all of the comparators 260 are high (i.e., all bits matched), these matching entry are one of the highest weighted entries. If the outputs of all of the comparators 260 are high for only a single matching entry, that matching entry is output as the best match. If the outputs of all of the comparators 260 are high for more than one entry, the match resolution process may be repeated for another different weight field as described above to provide hierarchical match resolution.

In accordance with the invention, a match queue may be added into any typical CAM or the CAM device in accordance with the invention to enhance the match resolution process. In particular, associated data for all entries that match an input value and meet the match resolution criteria (highest weight) may be loaded into a first-in, first-out (FIFO) memory in priority order according to a second match criteria (such as CAM array position) to permit the resolution of multiple matches in an efficient manner. Now, an example of a single port large CAM device and a dual port CAM device in accordance with the invention will be described.

Figure 19:
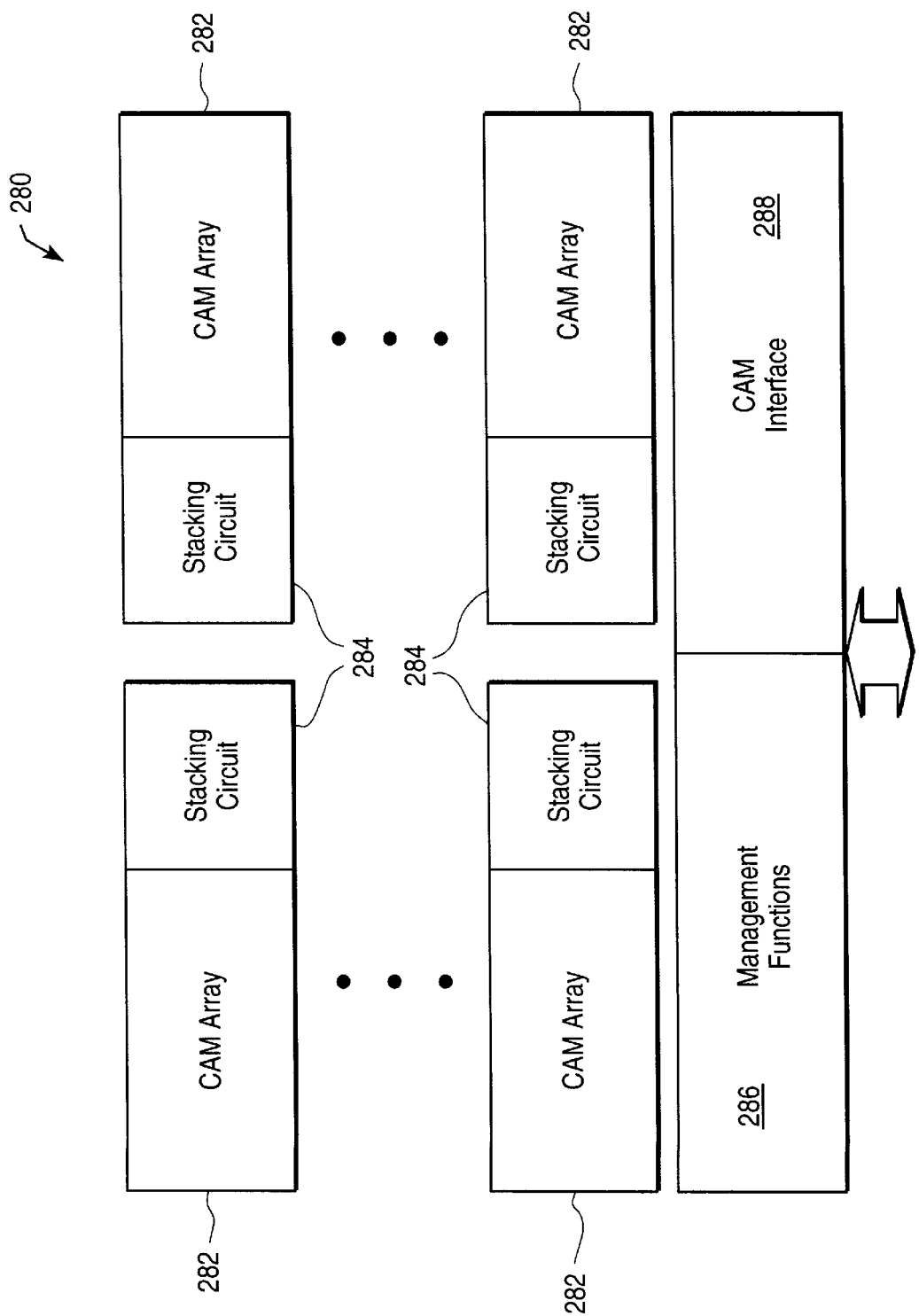
FIG. 19 is a diagram of an example of a large port CAM having an improved management interface and reconfiguration and stacking circuitry in accordance with the invention.

FIG. 19 is a diagram of an example of a large port CAM device 280 that includes one or more CAM arrays 282 and one or more associated stacking circuitry 284. Each CAM array 282 is similar to the CAM array described above and has the benefits of reduced power dissipation and the wide AND gate. In this example, each CAM array may be a 16k by 64 bit memory array and there may be four CAM arrays. The stacking circuitry 284 permits the CAM arrays to be easily configured in several different manners. In this example, the CAM device 280 may be configured to be a 64k by 64 bit CAM device (a large number of smaller size entries), a 32k by 128 bit CAM device or a 16k by 256 bit CAM device (fewer larger sized entries). In addition to configuring the CAM memory space, a portion of the CAM may be used for RAM memory so that, for example, a 128 bit entry may be subdivided into a 33 bit match field and a 95 bit associated data field.

The CAM device 280 may also include management circuitry 286 and a CAM interface 288. The management circuitry provides an internal free entry maintenance process, an add/delete entry command interface and an automatic initialization for reduced software overhead. The CAM device 280 has various advantages over conventional CAM devices. For example, the CAM device 280 may be larger, operates faster and have a lower power dissipation than conventional CAMs. Now, an example of a dual port CAM device will be described.

Figure 20:
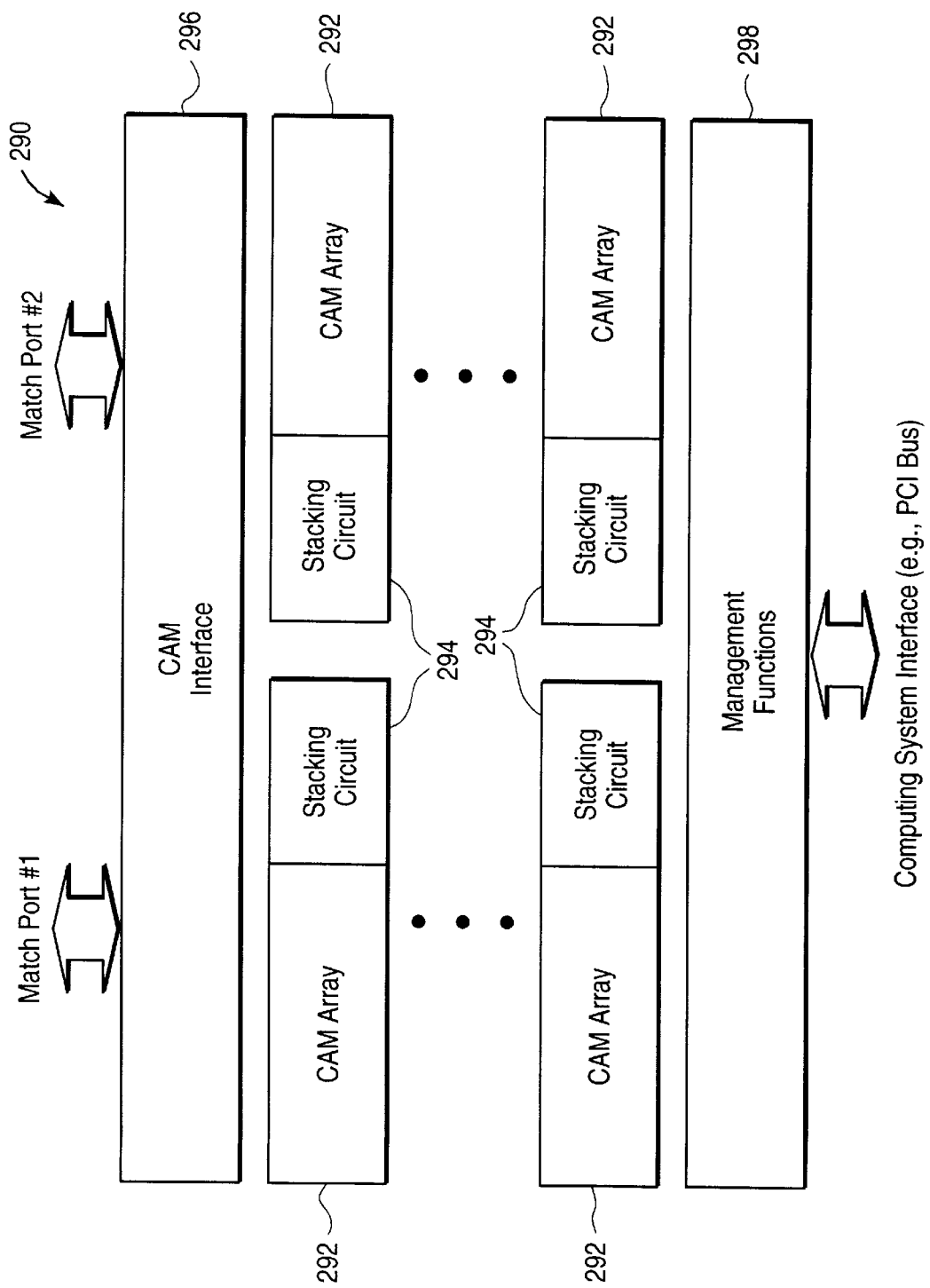
FIG. 20 is a diagram of an example of a dual port CAM having an improved management interface and reconfiguration and stacking circuitry in accordance with the invention.

FIG. 20 is a diagram of an example of a dual port CAM device 290 in accordance with the invention. The dual port CAM device 290 may include one or more CAM arrays 292 (four are in this example) and associated stacking circuitry 294 which have the same structure as described above with reference to FIG. 19 including the configuring the CAM arrays into four different configuration and using a portion of the CAM for RAM. The device 290 may also include a CAM interface 296 for connection to two different match ports as described above and management circuitry 298 for providing similar management functions as described above with reference to FIG. 19. The dual port CAM device 290 may be used for a variety of different purposes, such as the routing table matching engine for a IP router device or as an image processor. Now, an example of an event co-processor will be described.

Figure 21:
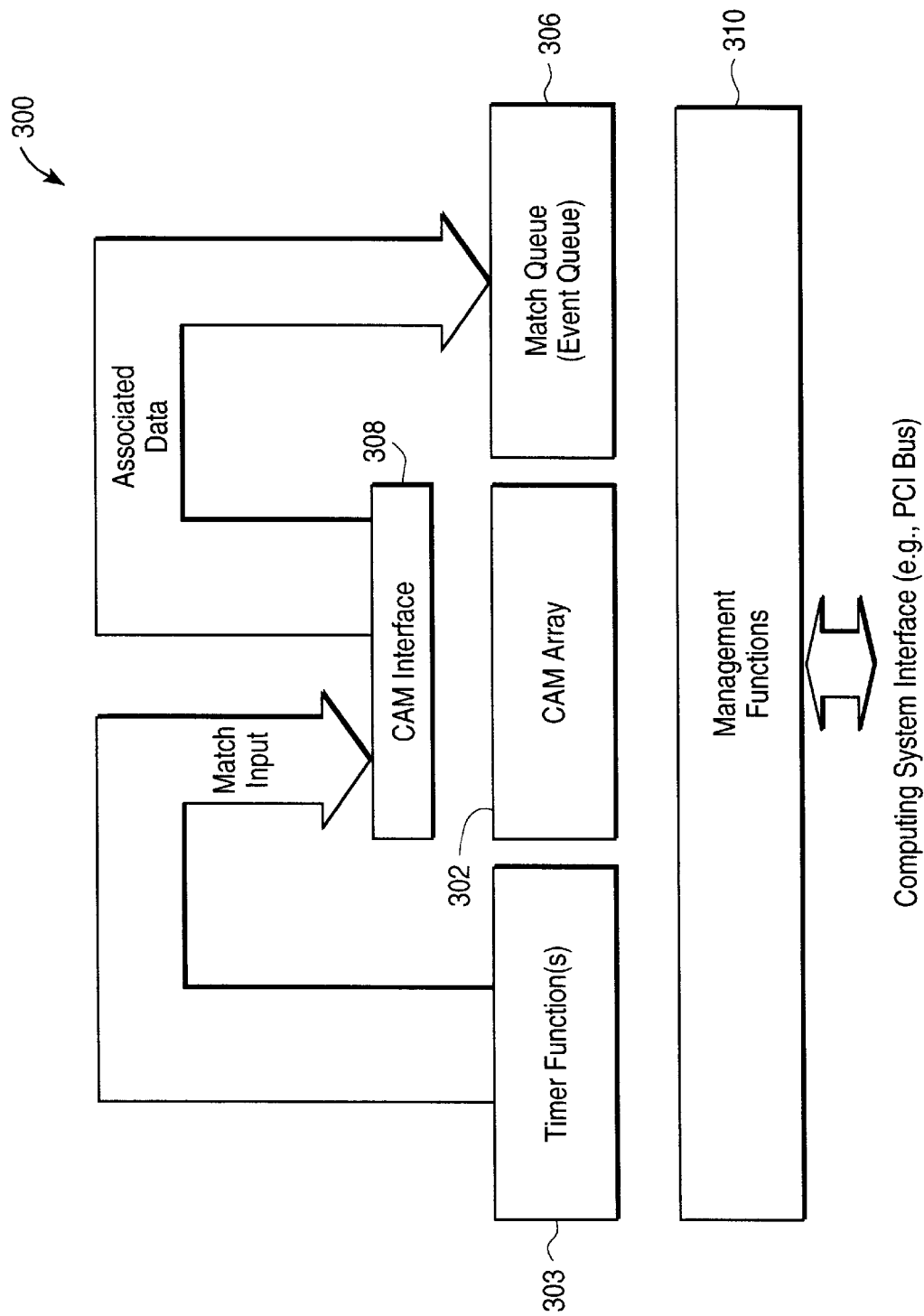
FIG. 21 is a diagram of an example of an event co-processor in accordance with the invention.

FIG. 21 is a diagram of an example of an event co-processor CAM device 300 in accordance with the invention. The event co-processor may be used, for example, for scheduling operating system (OS) time-tagged events. An example of a typical event co-processor CAM is described in U.S. Pat. No. 5,781,769 which is incorporated herein by reference. The event co-processor may include a CAM array 302 for storing entries in the CAM device, timer circuitry 304 for generating the time-tagged events, a match/event queue 306 which stores the matches from the CAM device, a CAM interface 308 for inputting and outputting data from the CAM array 308 and management circuitry 310 for controlling the operation of the CAM array. In operation, a time is generated by the timer 304 and fed into the CAM array as a match input. The CAM array 302 may contain a plurality of entries wherein each entry may contain a time when an event may occur (in the match field) and the associated event data (in the associated data field). Thus, the CAM device matches the time from the timer 304 with the entries to generate a list of events which should occur at that time and outputs the list of events into the event queue 306 so that the operating system may schedule the events. Now, an example of a database co-processor will be described.

Figure 22:
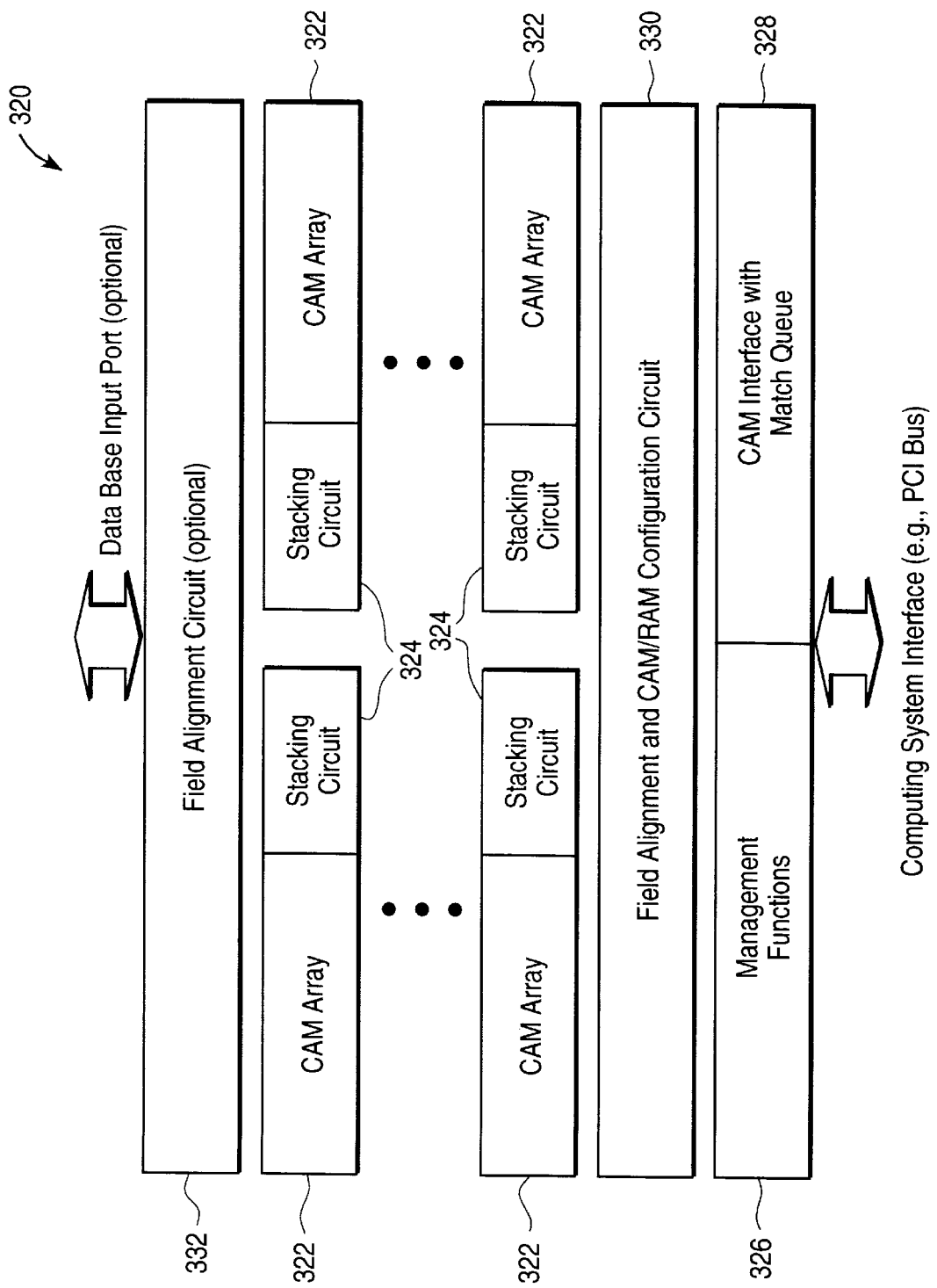
FIG. 22 is a diagram illustrating an example of a database co-processor in accordance with the invention.

FIG. 22 is a diagram illustrating an example of a database co-processor 320 in accordance with the invention. The database co-processor 320 may be used as a database search accelerator. For this purpose, the CAM arrays are arranged into a smaller number of wider entries and the CAM/RAM partition is dynamically changed to allow searching and sorting by multiple key fields. Similar to the above example, the database co-processor 320 includes one or more CAM arrays 322 and associated stacking circuitry 324, a management system 326 and a CAM interface with match queue 328 whose operation which will not be described here. The co-processor 320 may also include a field alignment and configuration circuit 330 which aligns the one or more input keys with the corresponding bit positions in the CAM array and enables the CAM match functions for the appropriate bits. Once matches have occurred, the circuit 330 may rearrange the "key" and associated data fields for all matching entries and store them in priority order in the match queue. The co-processor 320 may include a database input port and field alignment circuit 332 which permits rapid loading of the CAM/RAM from a data source, such as a hard disk drive, since the circuit 332 aligns the data from the data source.

While the foregoing has been with reference to a particular embodiment of the invention, it will be appreciated by those skilled in the art that changes in this embodiment may be made without departing from the principles and spirit of the invention, the scope of which is defined by the appended claims.

What is claimed is:

1. A content addressable memory device comprising:
    a plurality of content addressable memory elements, each content addressable memory element comprising a memory cell for storing a bit and a compare cell for comparing the bit in the memory cell to a compare bit and for generating an output indicating whether the bit stored in the memory cell matches the compare bit; and
    a wide logic gate for combining the output of the compare cell from content addressable memory elements to generate a signal responsive to the output of the compare cell.

2. The device of claim 1, wherein the wide logic gate comprises a plurality of NAND and NOR logic gates arranged in an alternating sequence.

3. The device of claim 1, wherein the wide logic gate comprises a first layer of logic gates arranged in a hierarchical order and at least one upper layer of logic gates, the first layer of logic gates having a plurality of outputs and each upper layer of logic gates combining the plurality of outputs from the first layer of logic gates to generate the wide logic gate output.

4. The device of claim 3, wherein the logic gates in the first layer and the logic gates in each upper layer in the wide logic gate are stacked together.

5. The device of claim 1, further comprising a match resolution logic for providing hierarchical match resolutions, wherein the match resolution logic employs a CMOS transistor for reducing power dissipation.

6. The device of claim 5, further comprising a match queue for enhancing multiple match resolution processes.

7. A content addressable memory device providing separate match port access and management port access, the device comprising:
    a match port for permitting a match input to be fed into the content addressable memory device; and
    a management port, coupled to the match port, for permitting management of an address bus and a data bus of the content addressable memory device.

8. The device of claim 7, further comprising:
    a management logic unit for controlling the content addressable memory device, wherein the management logic is connected to a management port word line;
    a first pair of gates controlled by the management port word line; and
    a second pair of gates, coupled to the first pair of gates, controlled by an associated data word line.

9. A method for resolving at least two matching signals in a content addressable memory device, the signals having a first weight indicative of a result of an application of a first match criteria, the method comprising:
    receiving the matching signals;
    applying a second match criteria to determine a second weight for each matching signal; and
    resolving the matching signals using the second weight.

10. The method of claim 9, wherein the second criteria is a weight field stored in the content addressable memory device.

11. The method of claim 9, wherein the second criteria is a number of matching bits in each matching signal.

12. The method of claim 9, wherein the second criteria is a position of each matching signal in the content addressable memory device.

13. A method for generating a matching signal in a content addressable memory device, the method comprising the steps of:
    reading a compare bit and a bit stored in a memory cell;
    comparing the compare bit with the bit stored in the memory cell and generating an output signal indicative of whether the bit stored in the memory cell matches the compare bit; and
    combining a plurality of output signals of the compare cell from content addressable memory elements to generate a signal responsive to the output signals of the compare cell.

14. A content addressable memory device including an individual bit masking for reducing power dissipation, the device comprising:
    a plurality of content addressable memory elements, each content addressable element comprising:
        a first memory cell, connected to a bitline, for storing a mask bit;
        a second memory cell, connected to an inverted bitline, for storing a content bit of the content addressable memory device; and
        a compare cell for comparing a compare bit with the received content bit and mask bit and for generating an output signal indicative of whether the mask bit and the content bit match the compare bit; and
    a logic gate for combining a plurality of output signals of the compare cell from content addressable memory elements to generate a signal responsive to the output signals of the compare cell.

15. The device of claim 14, wherein the compare cell comprises:
    a first transistor driven by an inverted mask signal for pulling the outputs of the compare cell to a high signal when the compare bit matches the content bit; and
    a second transistor driven by an inverted mask signal for pulling the output of the compare cell to a low signal when the compare bit does not match the content bit.

16. A system for generating a matching signal in a content addressable memory device, the system comprising:
    reading means for reading a compare bit and a bit stored in a memory cell;
    comparing means for comparing the compare bit with the bit stored in the memory cell;
    outputting means for generating an output signal indicating whether the bit stored in the memory cell matches the compare bit; and
    generating means for combining the output signals from the compare cell in content addressable memory elements to generate a signal responsive to the output signals of the compare cell.

* * * * *